(12) United States Patent
Jung et al.

(10) Patent No.: US 12,307,036 B2
(45) Date of Patent: May 20, 2025

(54) DISPLAY DEVICE

(71) Applicant: LG Display Co., Ltd., Seoul (KR)

(72) Inventors: JiHyun Jung, Seoul (KR); DeukSu Lee, Seoul (KR); SuChang An, Seoul (KR); JaeGyun Lee, Seoul (KR); Ruda Rhe, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/342,621

(22) Filed: Jun. 27, 2023

(65) Prior Publication Data

US 2024/0004488 A1 Jan. 4, 2024

(30) Foreign Application Priority Data

Jul. 4, 2022 (KR) .................. 10-2022-0081599

(51) Int. Cl.
| | |
|---|---|
| *G06F 3/041* | (2006.01) |
| *G06F 3/044* | (2006.01) |
| *H10K 59/126* | (2023.01) |
| *H10K 59/131* | (2023.01) |
| *H10K 59/40* | (2023.01) |

(52) U.S. Cl.
CPC ........ *G06F 3/0412* (2013.01); *G06F 3/04164* (2019.05); *G06F 3/0443* (2019.05); *G06F 3/0446* (2019.05); *H10K 59/126* (2023.02); *H10K 59/131* (2023.02); *H10K 59/40* (2023.02); *G06F 2203/04107* (2013.01); *G06F 2203/04111* (2013.01)

(58) Field of Classification Search
CPC .... G06F 3/0412; G06F 3/0443; G06F 3/0446; G06F 3/044; G06F 2203/04107; H10K 59/126; H10K 59/40; H10K 59/131
See application file for complete search history.

(56) References Cited

U.S. PATENT DOCUMENTS

| | | | |
|---|---|---|---|
| 2015/0145808 A1* | 5/2015 | Cho | .................. G06F 3/0412 345/174 |
| 2018/0166507 A1* | 6/2018 | Hwang | ............... G06F 3/04166 |
| 2019/0204952 A1* | 7/2019 | Han | .................. G06F 3/041662 |
| 2021/0141479 A1* | 5/2021 | Lee | ...................... H10K 59/126 |

\* cited by examiner

*Primary Examiner* — Xuemei Zheng
(74) *Attorney, Agent, or Firm* — Seed IP Law Group LLP

(57) ABSTRACT

A display device according to an embodiment comprises a substrate including a display area where subpixels are disposed and a non-display area outside the display area, each of the subpixels including an anode electrode, a light emitting layer, and a cathode electrode for displaying an image, an encapsulation layer positioned on the substrate, a shielding electrode positioned on the encapsulation layer, an intermediate organic layer positioned on the shielding electrode, a touch electrode positioned on the intermediate organic layer, a touch insulation layer positioned on the touch electrode, a shielding electrode line electrically connected with the shielding electrode, and a shielding electrode pad electrically connected with the shielding electrode line. The shielding electrode receives a voltage through the shielding electrode pad.

22 Claims, 14 Drawing Sheets

DISPLAY DEVICE

CROSS-REFERENCE TO RELATED APPLICATION

This application claims priority from Korean Patent Application No. 10-2022-0081599, filed on Jul. 4, 2022, which is hereby incorporated by reference for all purposes as if fully set forth herein.

BACKGROUND

Technical Field

The disclosure relates to a display device, and more particularly, to a display device including a touch electrode.

Description of the Related Art

With the development of the information society, the demand for display devices that display images is increasing, and various types of display devices are utilized, such as liquid crystal display devices, organic light-emitting devices, etc.

To provide more diverse functions to the user, the display device recognizes a touch by the user's finger or pen in contact with the display panel and provides a function of performing input processing based on the recognized touch.

The display device may include a plurality of touch electrodes disposed on the display panel or embedded in the display panel. The user's touch on the display panel may be sensed by detecting a change in capacitance caused by the user's touch.

BRIEF SUMMARY

The inventor's have realized that touch sensitivity may be lowered due to parasitic capacitance generated between the touch electrode and an electrode (e.g., the cathode electrode) of the display panel.

An object of the disclosure is to provide a display device capable of reducing noise due to parasitic capacitance generated between a cathode electrode and a touch electrode.

A display device according to an embodiment comprises a substrate including a display area where subpixels are disposed and a non-display area outside the display area, each of the subpixels including an anode electrode, a light emitting layer, and a cathode electrode for displaying an image, an encapsulation layer positioned on the substrate, a shielding electrode positioned on the encapsulation layer, an intermediate organic layer positioned on the shielding electrode, a touch electrode positioned on the intermediate organic layer, a touch insulation layer positioned on the touch electrode, a shielding electrode line electrically connected with the shielding electrode, and a shielding electrode pad electrically connected with the shielding electrode line. The shielding electrode may receive a voltage through the shielding electrode pad.

The shielding electrode may at least partially overlap the touch electrode.

The shielding electrode may include a first shielding electrode having a mesh shape and structure. The touch electrode may have a mesh shape and structure. The first shielding electrode may at least partially overlap the touch electrode.

The display device may further comprise an intermediate buffer layer positioned between the encapsulation layer and the shielding electrode and a touch buffer layer positioned between the intermediate organic layer and the touch electrode.

The shielding electrode may include a lower shielding electrode line extending from the shielding electrode and an upper shielding electrode line disposed on the touch insulation layer and electrically connected with the lower shielding electrode line.

In the non-display area, the upper shielding electrode line and the lower shielding electrode line may be electrically connected through a contact hole of the touch insulation layer and the touch buffer layer.

The non-display area may include a dam area where at least one dam is disposed and a pad area where at least one pad is disposed. The dam area may surround at least one surface of the display area. One side of the intermediate organic layer may be positioned adjacent to one side of the at least one dam and is disposed between the display area and the dam area.

In the pad area, the shielding electrode line may be electrically connected with a driving low voltage line exposed by the intermediate buffer layer.

The display device may further comprise a touch electrode line electrically connected with the touch electrode and a touch pad electrically connected with the touch electrode line. The touch electrode may include a first touch electrode and a second touch electrode. The touch electrode line may include a first touch electrode line electrically connected with the first touch electrode and a second touch electrode line electrically connected with the second touch electrode. The touch pad may include a first touch pad electrically connected with the first touch electrode line to apply a touch driving signal to the first touch electrode and a second touch pad electrically connected with the second touch electrode line to receive a touch sensing signal from the second touch electrode.

In the display driving according to an embodiment, the shielding electrode shields noise due to the parasitic capacitance generated between the cathode electrode and the touch electrode, thereby enhancing the touch sensing performance of the display device.

The effects of an embodiment are not limited by the foregoing, and other various effects are included in the disclosure.

BRIEF DESCRIPTION OF THE SEVERAL VIEWS OF THE DRAWINGS

The above and other objects, features, and advantages of the disclosure will be more clearly understood from the following detailed description, taken in conjunction with the accompanying drawings, in which.

DETAILED DESCRIPTION

Figure 1:
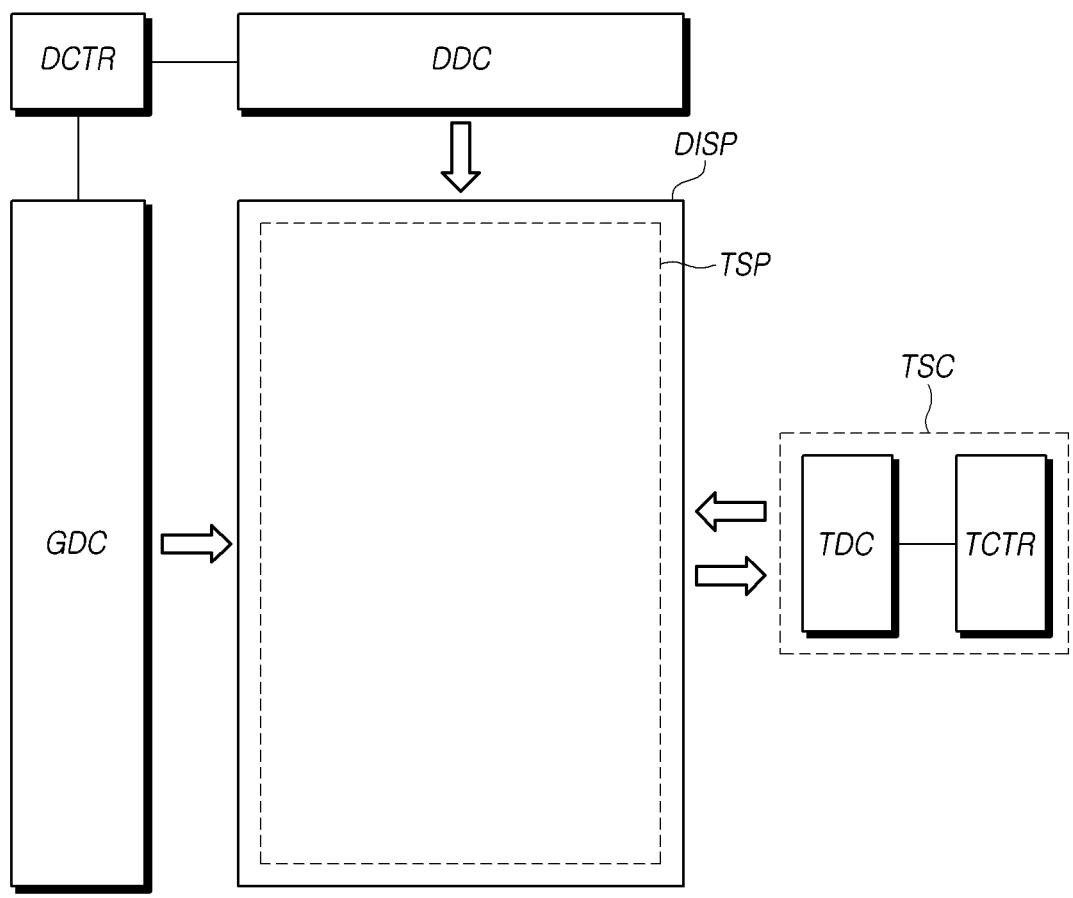
FIG. 1 is a view schematically illustrating a configuration of a display device according to an embodiment.

Some embodiments of the disclosure are described in detail below with reference to exemplary drawings. In assigning reference numerals to components of each drawing, the same components may be assigned the same numerals even when they are shown on different drawings. When determined to make the subject matter of the disclosure unclear, the detailed description of the known configurations or functions may be skipped. As used herein, when a component "includes," "has," or "is composed of" another component, the component may add other components unless the component "only" includes, has, or is composed of the other component. As used herein, the singular forms "a," "an," and "the" are intended to include the plural forms as well, unless the context clearly indicates otherwise.

Further, in describing the components of the disclosure, terms, such as first, second, A, B, (a), and (b), may be used. These denotations are provided merely to distinguish a component from another, and the essence, order, or number of the components are not limited by the denotations.

In describing the positional relationship between components, when two or more components are described as "connected," "coupled" or "linked," the two or more components may be directly "connected," "coupled" or "linked," or another component may intervene. Here, the other component may be included in one or more of the two or more components that are "connected," "coupled" or "linked" to each other.

When such terms as, e.g., "after," "next to," "after," and "before," are used to describe the temporal flow or relationship related to components, operation methods, and fabricating methods, it may include a non-continuous relationship unless the term "immediately" or "directly" is used.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure. Meanwhile, if a numerical value or its corresponding information (e.g., level, etc.) is mentioned for a component, it may be interpreted that the numerical value or its corresponding information includes a margin of error that may be caused by various factors (e.g., process factors, internal or external shocks, noise, etc.), even if it is not explicitly stated otherwise.

Hereinafter, with reference to the drawings related to embodiments of the disclosure, a display device according to an embodiment of the disclosure will be described.

FIG. 1 is a view schematically illustrating a configuration of a display device according to an embodiment.

Referring to FIG. 1, a display device according to an embodiment may provide both a function for image display and a function for touch sensing.

To provide the image display function, the display device according to an embodiment may include a display panel DISP having a plurality of data lines and a plurality of gate lines disposed thereon and having a plurality of subpixels defined by the plurality of data lines and the plurality of gate lines arranged thereon, a data driving circuit DDC driving the plurality of data lines, a gate driving circuit GDC driving the plurality of gate lines, and a display controller DCTR controlling the operation of the data driving circuit DDC and the gate driving circuit GDC.

Each of the data driving circuit DDC, gate driving circuit GDC, and display controller DCTR may be implemented as one or more individual components. In some cases, two or more of the data driving circuit DDC, the gate driving circuit GDC, and the display controller DCTR may be integrated and implemented as one component. For example, the data driving circuit DDC and the display controller DCTR may be implemented as one integrated circuit chip (IC Chip).

To provide the touch sensing function, the display device according to an embodiment may include a touch panel TSP including a plurality of touch electrodes and a touch sensing circuit TSC for supplying a touch driving signal to the touch panel TSP, detecting a touch sensing signal from the touch panel TSP, and sensing the presence or absence of a user's touch or a touch position (or coordinates of touch) on the touch panel TSP based on the detected touch sensing signal.

For example, the touch sensing circuit TSC may include a touch driving circuit TDC supplying a touch driving signal to the touch panel TSP and detecting a touch sensing signal from the touch panel TSP and a touch controller TCTR sensing the presence or absence of the user's touch and/or the position of touch on the touch panel TSP based on the touch sensing signal detected by the touch driving circuit TDC.

The touch driving circuit TDC may include a first circuit part supplying a touch driving signal to the touch panel TSP and a second circuit part detecting a touch sensing signal from the touch panel TSP.

The touch driving circuit TDC and the touch controller TCTR may be implemented as separate components or, in some cases, may be integrated and implemented as one component. Meanwhile, each of the data driving circuit DDC, gate driving circuit GDC and touch driving circuit TDC may be implemented as one or more integrated circuits and, in terms of electrical connection with the display panel DISP, be implemented in a chip-on-glass (COG) type, a chip-on-film (COF) type, or a tape carrier package (TCP) type. The gate driving circuit GDC may also be implemented in a gate-in-panel (GIP) type.

Meanwhile, each of the circuit components DDC, GDC, and DCTR for display driving and the circuit components TDC and TCTR for touch sensing may be implemented as one or more individual components. In some cases, one or more of the circuit components DDC, GDC, and DCTR for display driving and one or more of the circuit components TDC and TCTR for touch sensing may be functionally integrated and implemented as one or more components. For example, the data driving circuit DDC and the touch driving circuit TDC may be implemented by being integrated into one or more integrated circuit chips. When the data driving circuit DDC and the touch driving circuit TDC are integrated into two or more integrated circuit chips, each of the two or more integrated circuit chips may have a data driving function and a touch driving function.

Meanwhile, the display device according to an embodiment may be of various types, such as an organic light emitting display device and a liquid crystal display device. Hereinafter, for convenience of description, the display device is described as an organic light emitting display device as an example. In other words, the display panel DISP may be of various types, such as an organic light emitting display panel and a liquid crystal display panel, but hereinafter, for convenience of description, the display panel DISP is described as being an organic light emitting display panel as an example.

Meanwhile, as is described below, the touch panel TSP may include a plurality of touch electrodes where a touch driving signal may be applied or a touch sensing signal may be detected, and a plurality of touch electrode lines for connecting the plurality of touch electrodes to the touch driving circuit TDC.

The touch panel TSP may be present outside the display panel DISP. In other words, the touch panel TSP and the display panel DISP may be separately manufactured and combined. Such a touch panel TSP is referred to as an external type or an add-on type.

Alternatively, the touch panel TSP may be embedded inside the display panel DISP. In other words, when manufacturing the display panel DISP, the touch sensor structure, such as the plurality of touch electrodes and the plurality of touch electrode lines constituting the touch panel TSP, may be formed together with electrodes and signal lines for display driving. Such a touch panel TSP is referred to as an embedded type. Hereinafter, for convenience of description, an example in which the touch panel TSP is an embedded type is described.

Hereinafter, referring to FIG. 2, a display panel according to an embodiment is described.

Figure 2:
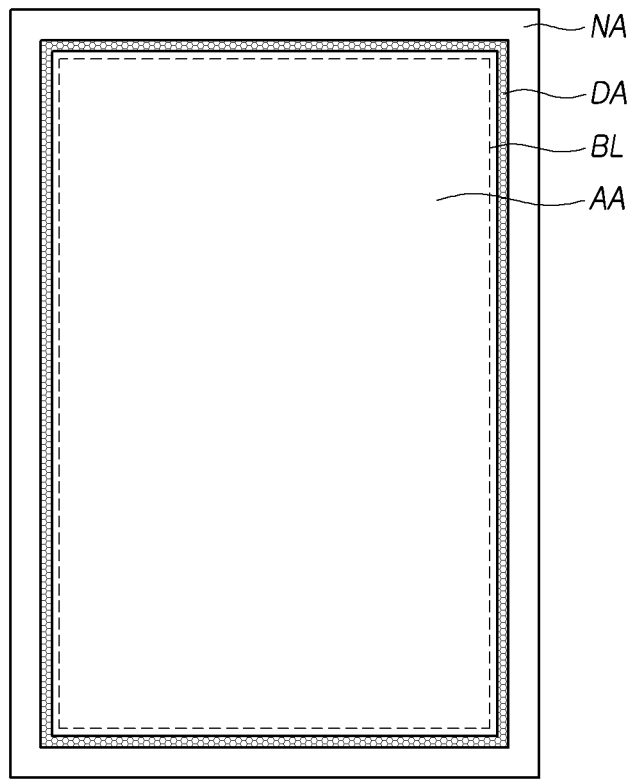
FIG. 2 is a view schematically illustrating a display panel of a display device according to an embodiment.

FIG. 2 is a view schematically illustrating a display panel of a display device according to an embodiment.

Referring to FIG. 2, the display panel DISP may include a display area AA where an image is displayed and a non-display area NA which is an outer area surrounding the outer boundary line BL of the display area AA.

In the display area AA of the display panel DISP, a plurality of subpixels for image display and various electrodes or signal lines for display driving are disposed. Further, a plurality of touch electrodes for touch sensing and a plurality of touch electrode lines electrically connected thereto may be disposed in the display area AA of the display panel DISP. Accordingly, the display area AA may also be referred to as a touch sensing area where touch sensing is possible.

In the non-display area NA of the display panel DISP, link lines extending from various signal lines disposed in the display area AA or link lines electrically connected with various signal lines disposed in the display area AA and pads electrically connected with the link lines are disposed. The pads disposed in the non-display area NA may be bonded to or electrically connected to display driving circuits (DDC, GDC, etc.).

In the non-display area NA of the display panel DISP, link lines extending from the plurality of touch electrode lines disposed in the display area AA or link lines electrically connected with the plurality of touch electrode lines disposed in the display area AA and pads electrically connected with the link lines are disposed. The pads disposed in the non-display area NA may be bonded to or electrically connected to the touch driving circuit TDC.

The non-display area NA may have an extension from a portion of the outermost touch electrode among the plurality of touch electrodes disposed in the display area AA and may further have one or more electrodes (touch electrodes) formed of the same material as the plurality of touch electrodes disposed in the display area AA.

In other words, the plurality of touch electrodes disposed on the display panel DISP may be all present in the display area AA, or some (e.g., outermost touch electrodes) among the plurality of touch electrodes disposed on the display panel DISP may be present in the non-display area NA, or some (e.g., outermost touch electrodes) among the plurality of touch electrodes disposed on the display panel DISP may be present in both the display area AA and the non-display area NA.

Meanwhile, referring to FIG. 2, the display panel DISP of the display device according to an embodiment may include a dam area DA for preventing a certain layer (e.g., encapsulation layer in an organic light emitting display panel) in the display area AA from collapsing.

The dam area DA may be positioned at a boundary between the display area AA and the non-display area NA or at any one point of the non-display area NA, which is an area outside the display area AA. The dam disposed in the dam area DA may be disposed while surrounding the display area AA in all directions or be disposed only outside one or two or more portions (e.g., portions with a layer that is easy to collapse) of the display area AA. The dams disposed in the dam area DA may have a single pattern connected to each other or two or more disconnected patterns. Further, only a first dam may be disposed in the dam area DA, or two dams (first dam and second dam) may be disposed. Three or more dams may be disposed. Only the first dam may be present in any one direction in the dam area DA, and the first dam and the second dam both may be present in any one other direction.

An embedded-type touch panel is described below with reference to FIG. 3.

Figure 3:
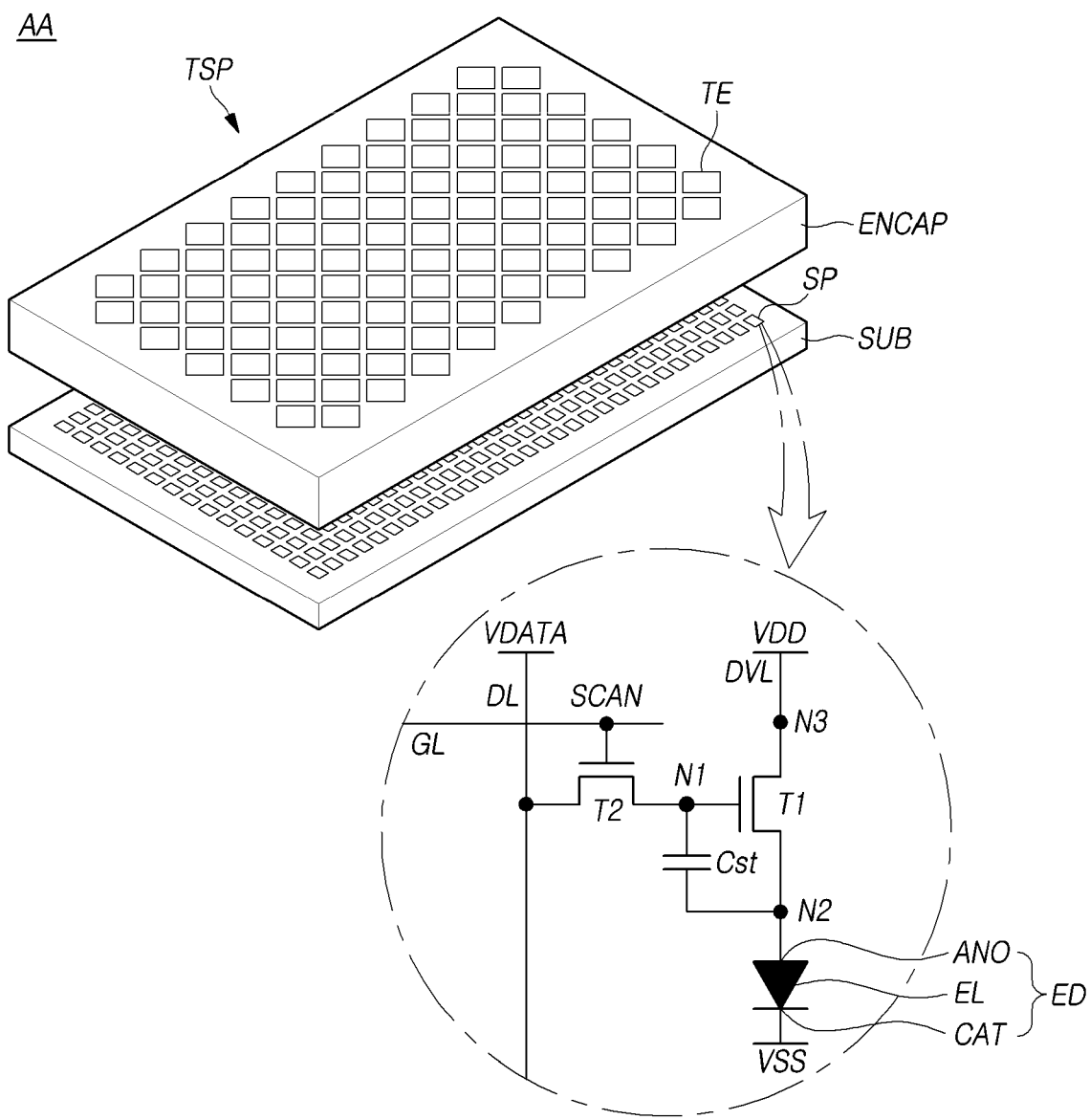
FIG. 3 is an example view illustrating a structure in which a touch panel is embedded in a display panel according to an embodiment.

FIG. 3 is an example view illustrating a structure in which a touch panel is embedded in a display panel according to an embodiment.

Referring to FIG. 3, a plurality of subpixels SP are arranged on a substrate SUB in the display area AA of the display panel DISP.

Each subpixel SP may include a light emitting element ED, a first transistor T1 for driving the light emitting element ED, a second transparency T2 for transferring a data voltage VDATA to a first node N1 of the first transistor T1, and a storage capacitor Cst for maintaining a predetermined voltage during one frame.

The first transistor T1 may include a first node N1 to which the data voltage VDATA may be applied, a second node N2 electrically connected with the light emitting element ED, and a third node N3 to which a driving voltage VDD is applied from a driving voltage line DVL. The first node N1 may be the gate node, the second node N2 may be the source node or the drain node, and the third node N3 may be the drain node or the source node. Such a first transistor T1 is also referred to as a driving transistor for driving the light emitting element ED.

The light emitting element ED may include an anode electrode ANO, a light emitting layer EL, and a cathode electrode CAT. The anode electrode ANO may be electrically connected to the second node N2 of the first transistor T1, and a base voltage (or driving low voltage) VSS may be applied to the cathode electrode CAT. The base voltage or driving low voltage can be applied to the cathode electrode CAT by cathode electrode line. In one embodiment, the cathode electrode is common electrode for a plurality of subpixels within the display area and the same common voltage is applied to all of these cathode electrodes at the same time. This can be supplied from a low voltage supply source, for example, from one or more low voltage supply pads. It can be a selected voltage, such as VSS, VSSL, or some other voltage. It could also be a combination of voltages, such as a DC voltage that may have low frequency AC voltage overlaid on top of it. In this light emitting element ED, the light emitting layer EL may be an organic light emitting layer including an organic material. In this case, the light emitting element ED may be an organic light emitting diode OLED.

The second transistor T2 may be controlled for on/off by the scan signal SCAN applied through the gate line GL, and be electrically connected between the first node N1 of the first transistor T1 and the data line DL. The second transistor T2 is also referred to as a switching transistor. When the second transistor T2 is turned on by the scan signal SCAN, it transfers the data voltage VDATA supplied from the data line DL to the first node N1 of the first transistor T1.

The storage capacitor Cst may be electrically connected between the first node N1 and the second node N2 of the first transistor T1.

As shown in FIG. 3, each subpixel SP may have a 2T1C structure including two transistors T1 and T2 and one capacitor Cst and, in some cases, may further include one or more transistors or one or more capacitor.

The storage capacitor Cst may be not a parasitic capacitor (e.g., Cgs or Cgd) that is an internal capacitor that may exist between the first node N1 and the second node N2 of the first transistor T1, but an external capacitor intentionally designed outside the first transistor T1.

Each of the first transistor T1 and the second transistor T2 may be an n-type transistor or a p-type transistor.

Meanwhile, as described above, circuit elements, such as a light emitting element ED, two or more transistors T1 and T2, and one or more capacitors Cst, are disposed on the display panel DISP. Since the circuit elements (in particular, light emitting element ED) are vulnerable to external moisture or oxygen, an encapsulation layer ENCAP may be disposed on the display panel DISP to prevent external moisture or oxygen from penetrating into the circuit elements (in particular, light emitting element ED). The encapsulation layer ENCAP may be formed of one or more layers.

Meanwhile, in the display device according to an embodiment, the touch panel TSP may be formed on the encapsulation layer ENCAP. In other words, in the display device, the touch sensor structure, such as a plurality of touch electrodes TE constituting the touch panel TSP, may be disposed on the encapsulation layer ENCAP.

During touch sensing, a touch driving signal or a touch sensing signal may be applied to the touch electrode TE. Therefore, during touch sensing, a potential difference may be formed between the touch electrode TE and the cathode electrode CAT disposed with the encapsulation layer ENCAP interposed therebetween, causing unnecessary parasitic capacitance. The parasitic capacitance may generate noise and lower touch sensitivity. Thus, to lower the parasitic capacitance, a separate electrode (i.e., shielding electrode) may be placed between the touch electrode TE and the cathode electrode CAT, shielding the noise generated between the touch electrode TE and the cathode electrode CAT.

A shielding electrode positioned between the touch electrode TE and the cathode electrode CAT in a display device according to an embodiment is described below in detail with reference to FIGS. 4 to 12.

Figure 4:
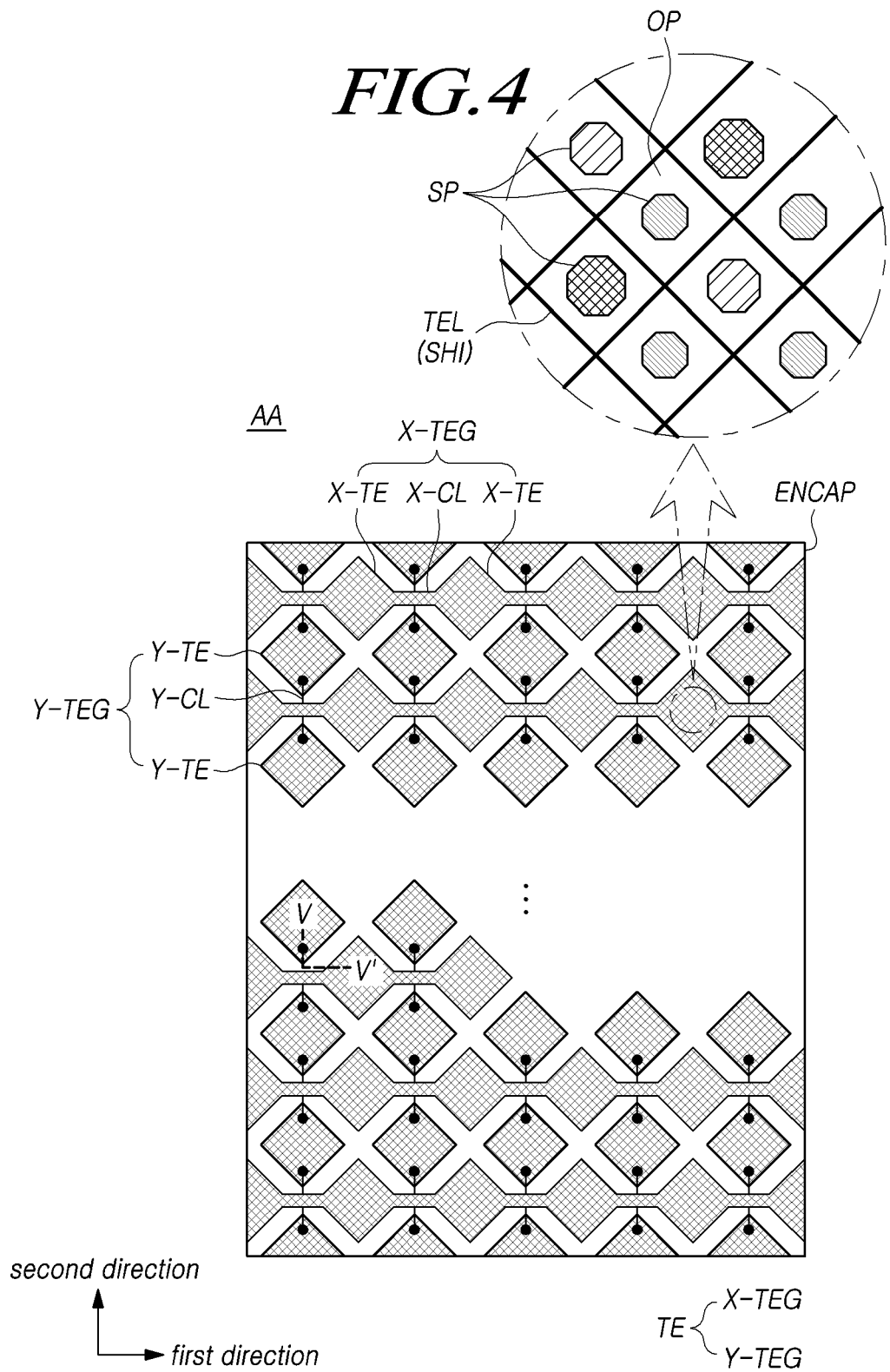
FIG. 4 is an example view illustrating a touch electrode and a shielding electrode of a touch panel according to an embodiment.
Figure 5:
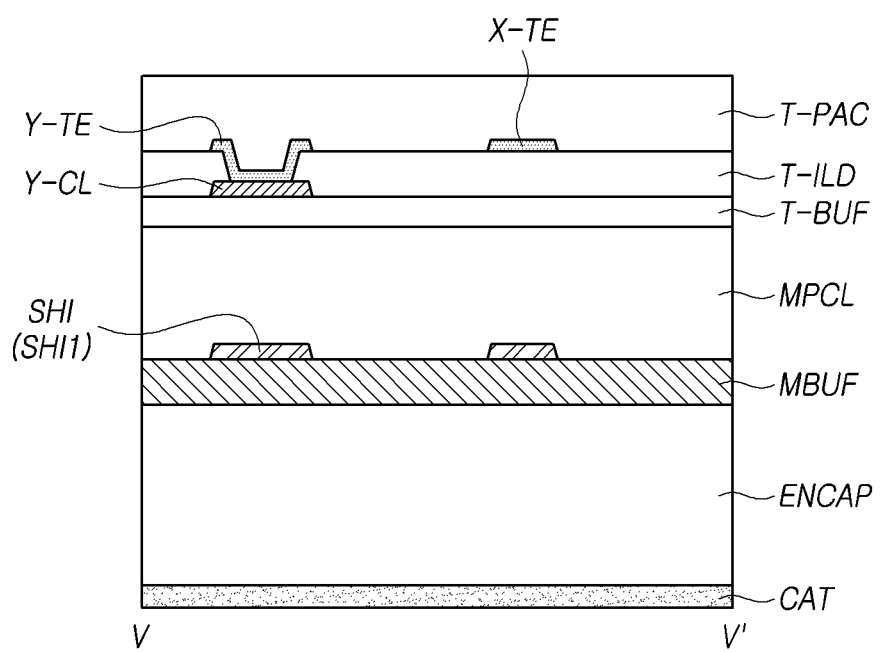
FIG. 5 is a cross-sectional view taken along line V-V' of FIG. 4.

FIG. 4 is an example view illustrating a touch electrode and a shielding electrode of a touch panel according to an embodiment. FIG. 5 is a cross-sectional view taken along line V-V' of FIG. 4.

Referring to FIGS. 4 and 5, a touch panel according to an embodiment may include a touch electrode TE and a shielding electrode SHI positioned on the encapsulation layer ENCAP. Here, referring to the enlarged view of FIG. 4, the touch electrode TE and the shielding electrode SHI are illustrated as indicating the same component (i.e., the touch electrode line TEL). Referring to the cross-sectional view of FIG. 5, the touch electrode TE and the shielding electrode SHI (or first shielding electrode SHI1) may overlap each other and may be positioned in the same area on a plane. Thus, the touch electrode TE and the shielding electrode of FIG. 4 may be understood as indicating different components. Further, although FIG. 5 primarily illustrates the configuration of an upper portion of the cathode electrode CAT, the components of FIGS. 9, 11, and 12 described below may be disposed in a lower portion of the cathode electrode CAT.

The touch electrode TE may include at least one first touch group X-TEG and at least one second touch group Y-TEG.

The first touch group X-TEG may include a plurality of first touch electrodes X-TE disposed side by side in a first direction and a first touch connection portion X-CL connecting the first touch electrodes X-TE to each other. The first touch connection portion X-CL may be positioned on the same layer as the first touch electrode X-TE and may contain the same material. The first touch electrodes X-TEs adjacent to each other may be electrically connected through the first touch connection portion X-CL. The plurality of first touch groups X-TEG may be disposed side by side in a second direction on the encapsulation layer ENCAP.

The second touch group Y-TEG may include a plurality of second touch electrodes Y-TE disposed side by side in the second direction and a second touch connection portion Y-CL connecting the second touch electrodes Y-TE to each other. The second touch connection portion Y-CL may be positioned on a different layer from the second touch electrode Y-TE. For example, the second touch connection portion Y-CL may be electrically connected with the second touch electrode Y-TE through a contact hole of the touch insulation layer T-ILD with the touch insulation layer T-ILD interposed therebetween in cross-sectional view. The plurality of second touch groups Y-TEG may be disposed side by side in the second direction on the encapsulation layer ENCAP.

In an embodiment, the touch electrode TE may be an electrode patterned in a mesh shape and having two or more openings OP. The touch electrode TE patterned in a mesh shape may include a touch electrode line TEL surrounding the opening OP. The touch electrode line TEL is a substantial part corresponding to the touch electrode TE, and is a part where the touch driving signal is applied or the touch sensing signal is detected. The touch electrode line TEL corresponding to each touch electrode TE may be positioned on a bank disposed in an area other than the emission area of two or more subpixels SP.

Each of the at least one opening OP present in each touch electrode TE may correspond to the emission area of one or more subpixels SP. In other words, the plurality of openings OA become a path through which the light emitted from the plurality of subpixels SP disposed thereunder passes upward. For convenience of description, an example in which each touch electrode TE is a mesh-type electrode is described below.

The shielding electrode SHI may be positioned to at least partially overlap the touch electrode line TEL. Further, the shielding electrode SHI may be positioned to at least partially overlap the touch electrode TE. Specifically, the shielding electrode SHI may overlap the touch electrode line TEL. In other words, the shielding electrode SHI may be patterned in the same mesh type as the touch electrode TE. In an embodiment, the width of the shielding electrode SHI may be the same as that of the touch electrode line TEL. According to an embodiment, the width of the shielding electrode SHI may be larger than that of the touch electrode line TEL. However, considering parasitic capacitance that may occur due to the shielding electrode SHI wider than the touch electrode line TEL, the width of the shielding electrode SHI may be appropriately implemented. The shielding electrode SHI may be patterned in a mesh type to extend from the display area AA to the area between the touch electrodes TE. Each of the at least one opening OP present in each shielding electrode SHI may correspond to the emission area of one or more subpixels SP.

According to an embodiment, the shielding electrode SHI may be a plate-shaped electrode positioned in the display area AA and having no opening OP. The mesh-type shielding electrode SHI shown in FIG. 5 may be referred to as a first shielding electrode SHI1, and the plate-shaped shielding electrode may be referred to as a second shielding electrode SHI2 (see FIGS. 6 and 7). A configuration further including the second shielding electrode is described below in detail in FIGS. 6 and 7.

According to an embodiment, the display device may include a cathode electrode CAT positioned under the encapsulation layer ENCAP, an intermediate buffer layer MBUF positioned over the encapsulation layer ENCAP, a shielding electrode SHI, an intermediate organic layer MPCL, a touch buffer layer T-BUF, a touch insulation layer T-ILD, and a touch protection layer T-PAC. The intermediate buffer layer MBUF is an electrical insulator and can be comprised of any acceptable insulating material, whether an organic or inorganic material. Although not shown, a circuit element layer including a driving transistor and a storage capacitor and a substrate may be positioned under the cathode electrode CAT.

In cross-sectional view, the shielding electrode SHI may be placed in the same position to overlap the second touch electrode Y-TE, the second touch connection portion Y-CL, and the first touch electrode X-TE. A predetermined voltage of a selected value (e.g., 0V, a driving low voltage, or a separate voltage) may be applied to the shielding electrode SHI. Therefore, the display device according to an embodiment may shield the potential difference between the first and second touch electrodes X-TE and Y-TE and the cathode electrode CAT, reducing noise generated between the first and second touch electrodes X-TE and Y-TE. In some embodiments, the low driven voltage is selected at 0 volts, while in other embodiments, it may be a VSS or VSSL or low voltage available in the circuit. In some embodiments, the low driven voltage is constant value of the DC type of voltage. In some embodiments, the driven voltage can be low frequency AC voltage that is place on the shielding layer SHI. For example, it could 30 Hz, 60 Hz, 120 Hz, 1 KHz, or other selected frequency, usually a low frequency value, that might also be overlaid at the same time on the common cathode voltage to cancel out any noise that might occur due to parasitic capacitance. In one embodiment, the voltage on the shielding electrode is floating and the shielding electrode reduces the parasitic capacitance that the touch electrode would have with the cathode that is held at ground or a lower VSS. In another embodiment, the voltage on the shielding electrode SHI is held near standard ground. In another embodiment, it is held at a DC voltage that is about midway between that of the cathode and the expected voltage on the touch electrode; in other embodiments, it is at 70% of the voltage between the VSS that will be placed cathode and the voltage that will be on the touch electrode. Thus, in one embodiment, the DC voltage on the shield electrode is held at about half, namely 50% of the value of the difference between the cathode voltage and the maximum voltage that will be present on the touch electrode, while in other embodiments it is at 70% of that voltage. The shield electrode is positioned directly below the mesh wires of the touch electrode and thus shields the effects of the cathode being at ground or a lower VSS. In yet another embodiment, the voltage on the shielding electrode SHI is matched with and tracks exactly the voltage that will be applied by the circuit to the touch electrode TE that is directly above it; in which case there cannot be a capacitor created between the shielding line SHI and the touch electrode. In some embodiments of the touch electrode circuit operation, a driving voltage might be applied to the touch electrodes while the system is in the sampling mode, waiting for a user to touch the screen. This same driving voltage is applied to the shield electrode SHI. Thus, there is no possibility of a parasitic capacitance with the cathode electrode and the touch electrode. There might be some parasitic capacitance between the shield SHI and the cathode, but this will not impact the response of the touch electrode that is used to sense the touch of a user. The outline shape of the touch electrode TE may be a quadrilateral, such as a diamond shape or a rhombus, or may be of other various shapes, such as a comb shape, a rectangle, a pentagon, or a hexagon. According to an embodiment, the touch electrode TE may be a plate-shaped electrode without an opening. In this case, the touch electrode TE may be a transparent electrode. The touch electrode TE may include a transparent electrode material to allow the light emitted from the plurality of subpixels SP disposed below to be transmitted upward. According to an embodiment, one or more dummy metals disconnected from the mesh-type touch electrode lines TEL may be present in the area of each touch electrode TE. The dummy metal may mitigate the visibility issue that the outline of the touch electrode line TEL is visible on the screen and adjust the magnitude of the capacitance for each touch electrode TE to thereby enhance touch sensitivity.

In the display device according to an embodiment, the touch panel may sense touch in a capacitance-based touch sensing scheme, e.g., using a mutual capacitance-based touch sensing scheme or a self capacitance-based touch sensing scheme.

In the mutual capacitance-based touch sensing scheme, the plurality of touch electrodes TE may be divided into driving touch electrodes (transmission touch electrode) where the touch driving signal is applied and sensing touch electrodes (reception touch electrodes) where the touch sensing signal is detected and which, together with the driving touch electrode, forms a capacitance.

In the mutual capacitance-based touch sensing scheme, the touch sensing circuit TSC (see FIG. 1) senses the presence or absence of touch and/or the position of touch based on a change in capacitance (mutual-capacitance) between the driving touch electrode and the sensing touch electrode depending on the presence or absence of, e.g., a finger or a pen.

In the self capacitance-based touch sensing scheme, each touch electrode TE serves as both a driving touch electrode and a sensing touch electrode. In other words, the touch sensing circuit TSC (see FIG. 1) applies the touch driving signal to one or more touch electrodes TE, detects the touch sensing signal through the touch electrode TE where the touch driving signal is applied to grasp a change in capacitance between the point, e.g., finger or pen, and the touch electrode TE based on the detected touch sensing signal, thereby sensing the presence or absence of touch and/or the position of touch. In the self capacitance-based touch sensing scheme, no distinction is made between the driving touch electrode and the sensing touch electrode.

As such, the display device according to an embodiment may perform touch sensing in the mutual capacitance-based touch sensing scheme or the self capacitance-based touch sensing scheme. However, in an embodiment, an example in which the display device performs mutual capacitance-based touch sensing and has a touch sensing signal for the purpose is described.

FIG. 4 is an example view illustrating a touch electrode of a touch panel according to an embodiment. FIG. 7 is a cross-sectional view taken along line VII-VII' of FIG. 6.

Figure 6:
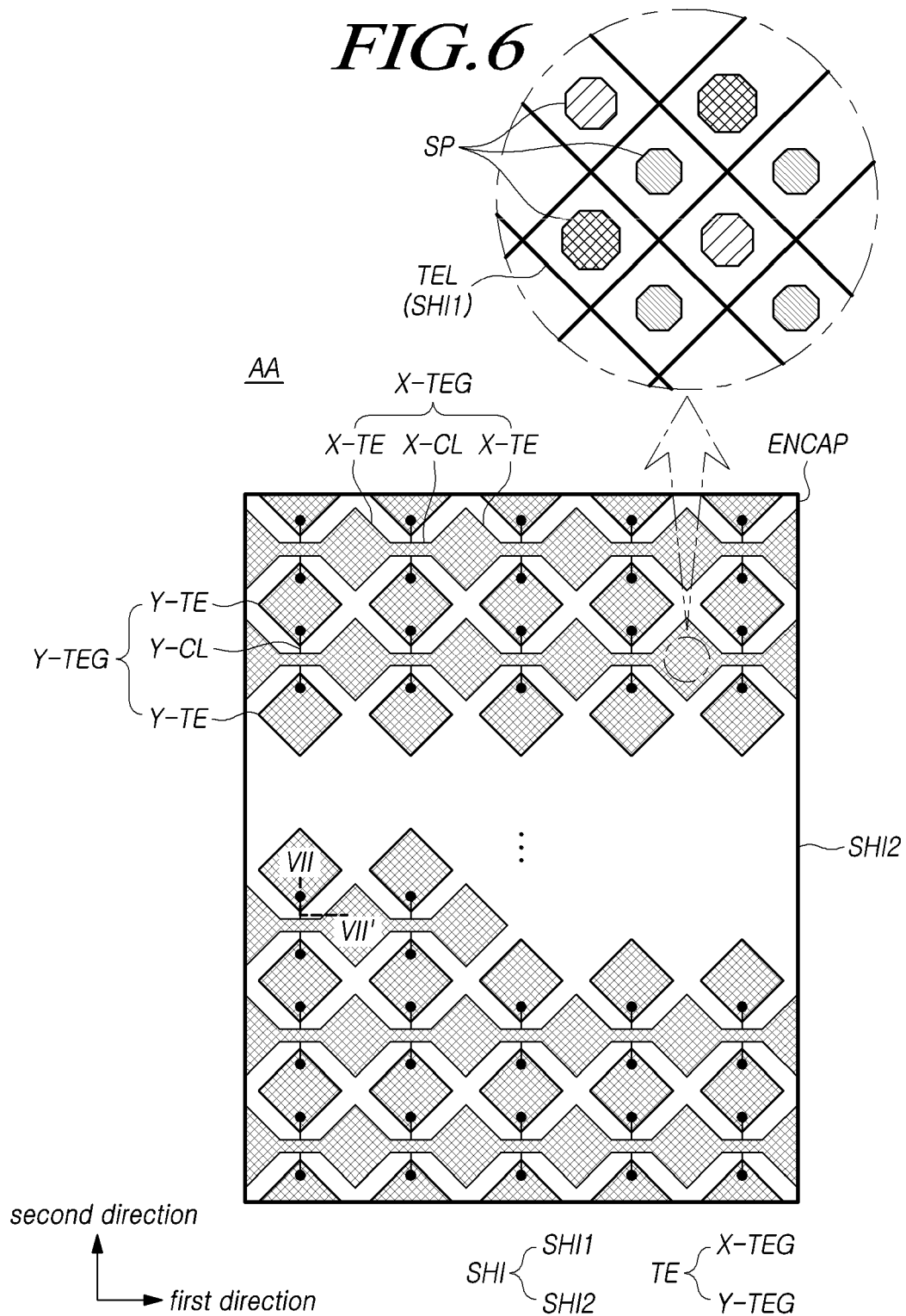
FIG. 6 is an example view illustrating a touch electrode of a touch panel according to an embodiment.
Figure 7:
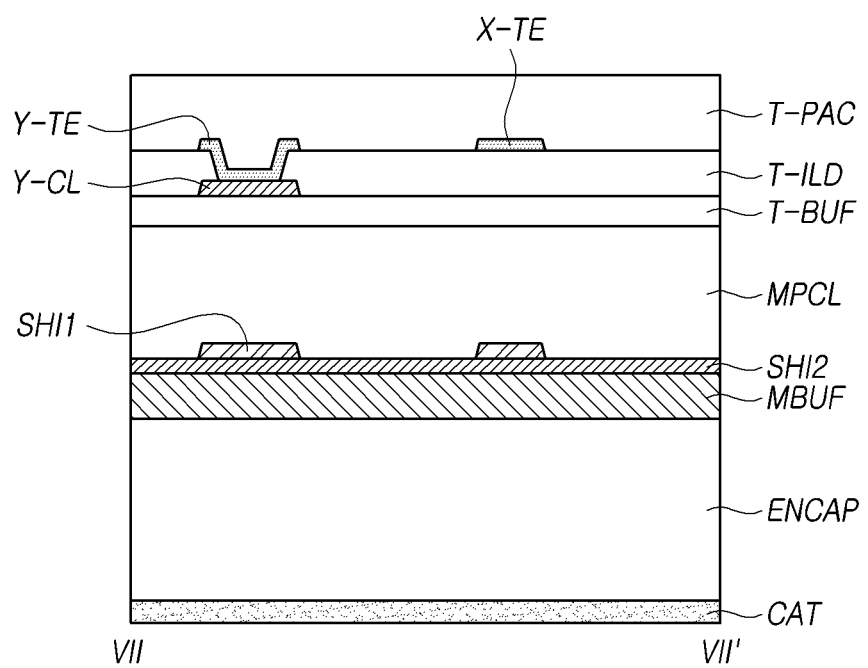
FIG. 7 is a cross-sectional view taken along line VII-VII' of FIG. 6.

Referring to FIGS. 6 and 7, a touch panel according to an embodiment may include a touch electrode TE and a shielding electrode SHI positioned on the encapsulation layer ENCAP. Since the configuration shown in FIGS. 6 and 7 is similar to the touch panel shown in FIGS. 4 and 5, the following description focuses primarily on the differences.

The shielding electrode SHI may include a mesh-shaped first shielding electrode SHI1 and a plate-shaped second shielding electrode SHI2. The first shielding electrode SHI1 may be a multilayer electrode including at least one of Ti, Al, W and Ta or alloys of any of them, such a AlSi alloy, etc. Thus, the first shielding electrode is not transparent in some embodiments and is composed of low resistivity, highly conductive material that is compatible with the semiconductor process being used.

The second touch electrode SHI2 may include a transparent electrode material to allow the light emitted from the plurality of subpixels SP disposed below to be transmitted upward. Accordingly, even when the second shielding electrode SHI2 is disposed, the visibility of the display device is not degraded. The second shielding electrode may be composed of ITO or similar transparent conductor and, while being electrically conductive, its conductivity is not as high as the first shielding electrode SHI1. The second shield layer can be a blanket deposited layer over the entire display area and have connections to many or all of the first shielding layers SHI1 and thus serve to ensure they all remain at the same voltage and assist it further limiting noise between them and in the circuit.

The second shielding electrode SHI2 may be positioned under the first shielding electrode SHI1. In other words, the second shielding electrode SHI2 may be positioned between the intermediate buffer layer MBUF and the first shielding electrode SHI1. The first shielding electrode SHI1 may directly contact the second shielding electrode SHI2. The first shielding electrode SHI1 may be electrically connected to the second shielding electrode SHI2. The second shielding electrode SHI2 may extend not only to the display area AA but also to a partial area of the non-display area NA.

Since the second shielding electrode SHI2 is electrically connected to the first shielding electrode SHI1, a predetermined voltage of a selected value (e.g., 0V, a driving low voltage, a separate voltage) applied through the first shielding electrode SHI1 may be applied to the second shielding electrode SHI2. In an embodiment, as the area of the shielding electrode increases through the first shielding electrode SHI1 and the second shielding electrode SHI2, the parasitic capacitance generated between the shielding electrode SHI and the cathode electrode CAT decreases.

Further, if a predetermined voltage is applied to the shielding electrode SHI, the parasitic capacitance generated between the touch electrode TE and the cathode electrode CAT, which is the sum of the first capacitance generated between the shielding electrode SHI and the touch electrode TE and the second capacitance generated between the shielding electrode SHI and the cathode electrode CAT, may be reduced due to the series connection operation. Therefore, the display device according to an embodiment may shield the potential difference between the first and second touch electrodes X-TE and Y-TE and the cathode electrode CAT, reducing noise generated between the first and second touch electrodes X-TE and Y-TE.

Figure 8:
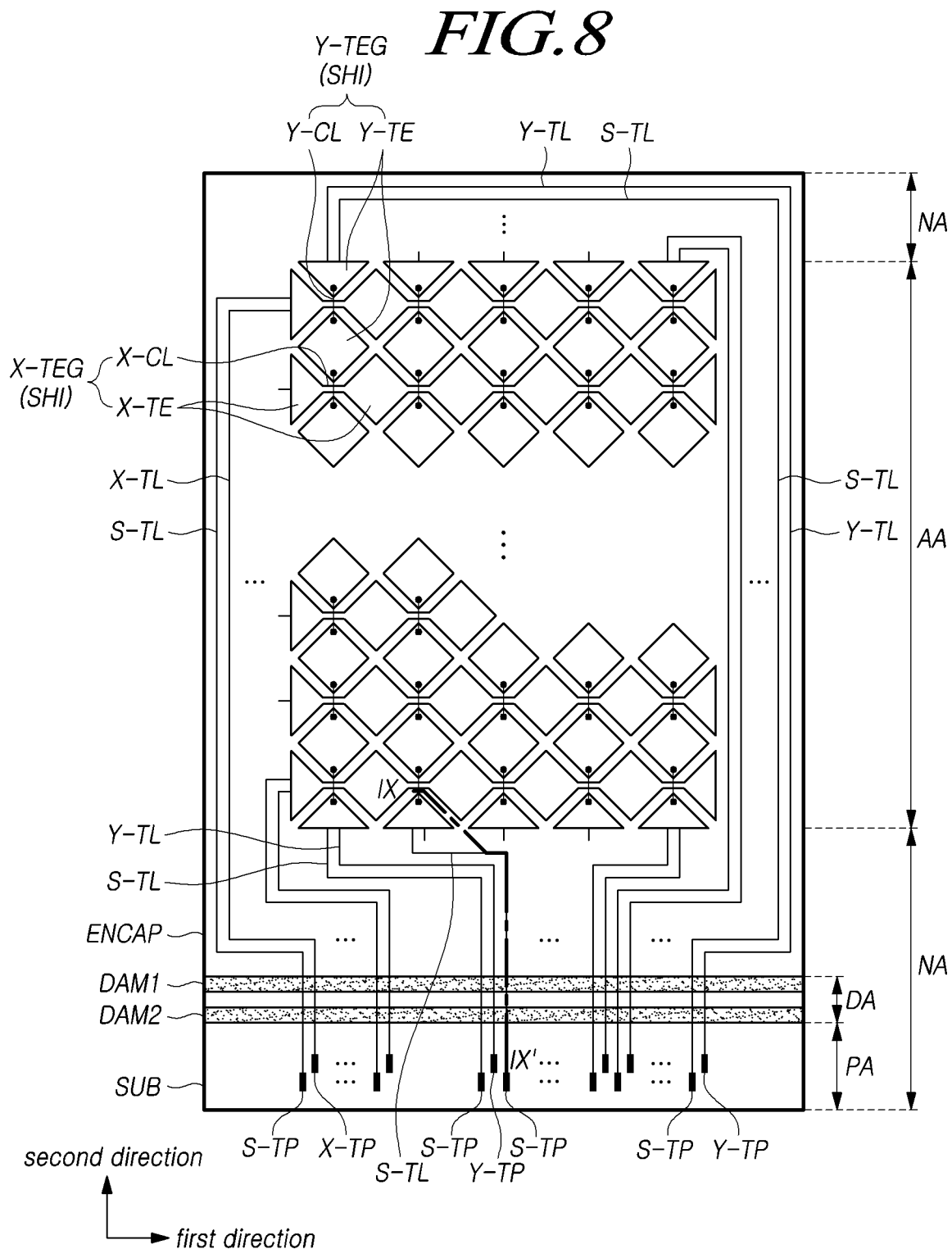
FIG. 8 is an example view illustrating a touch panel according to an embodiment.
Figure 9:
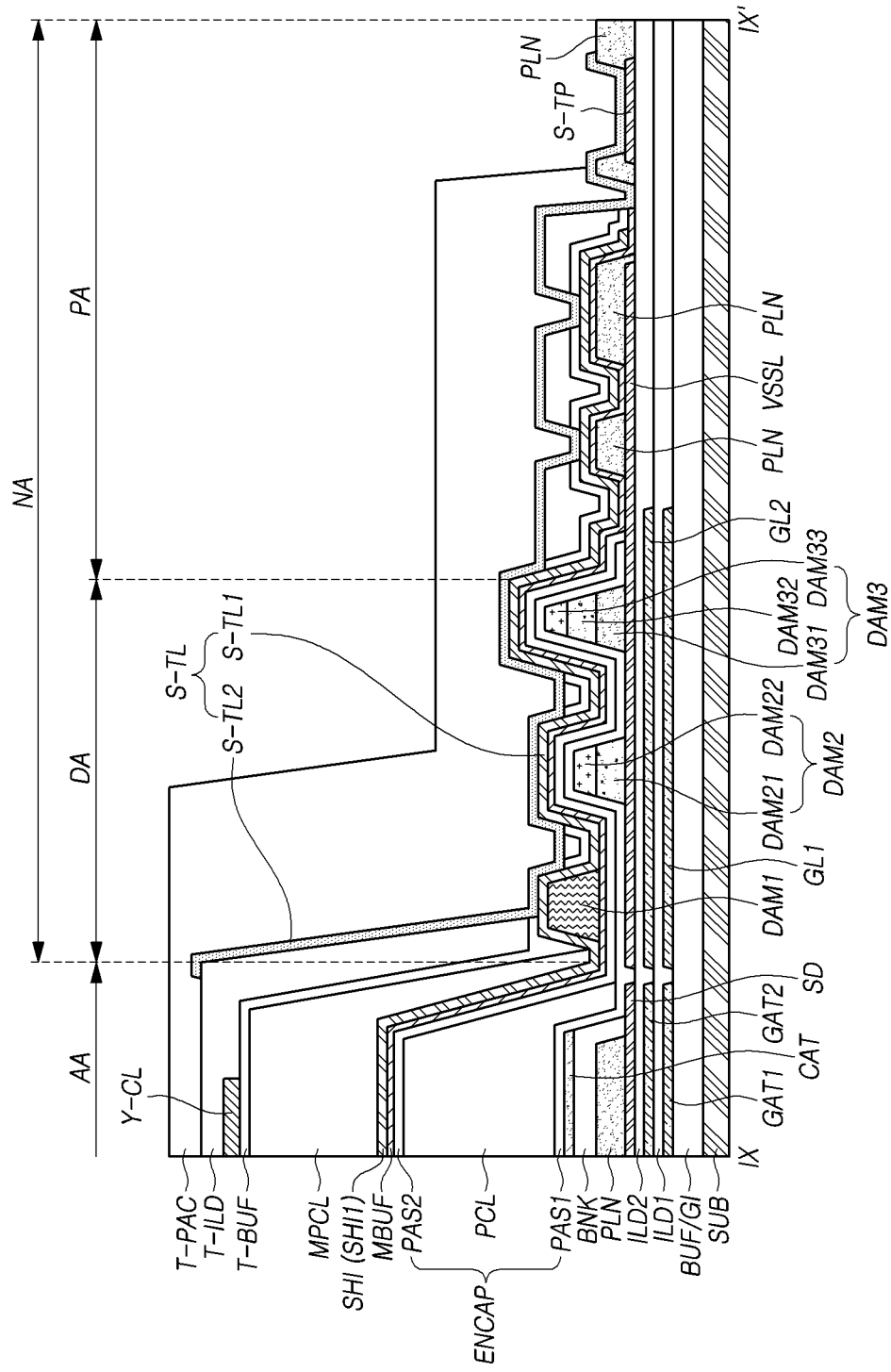
FIG. 9 is a cross-sectional view taken along line IX-IX' of FIG. 8.
Figure 10:
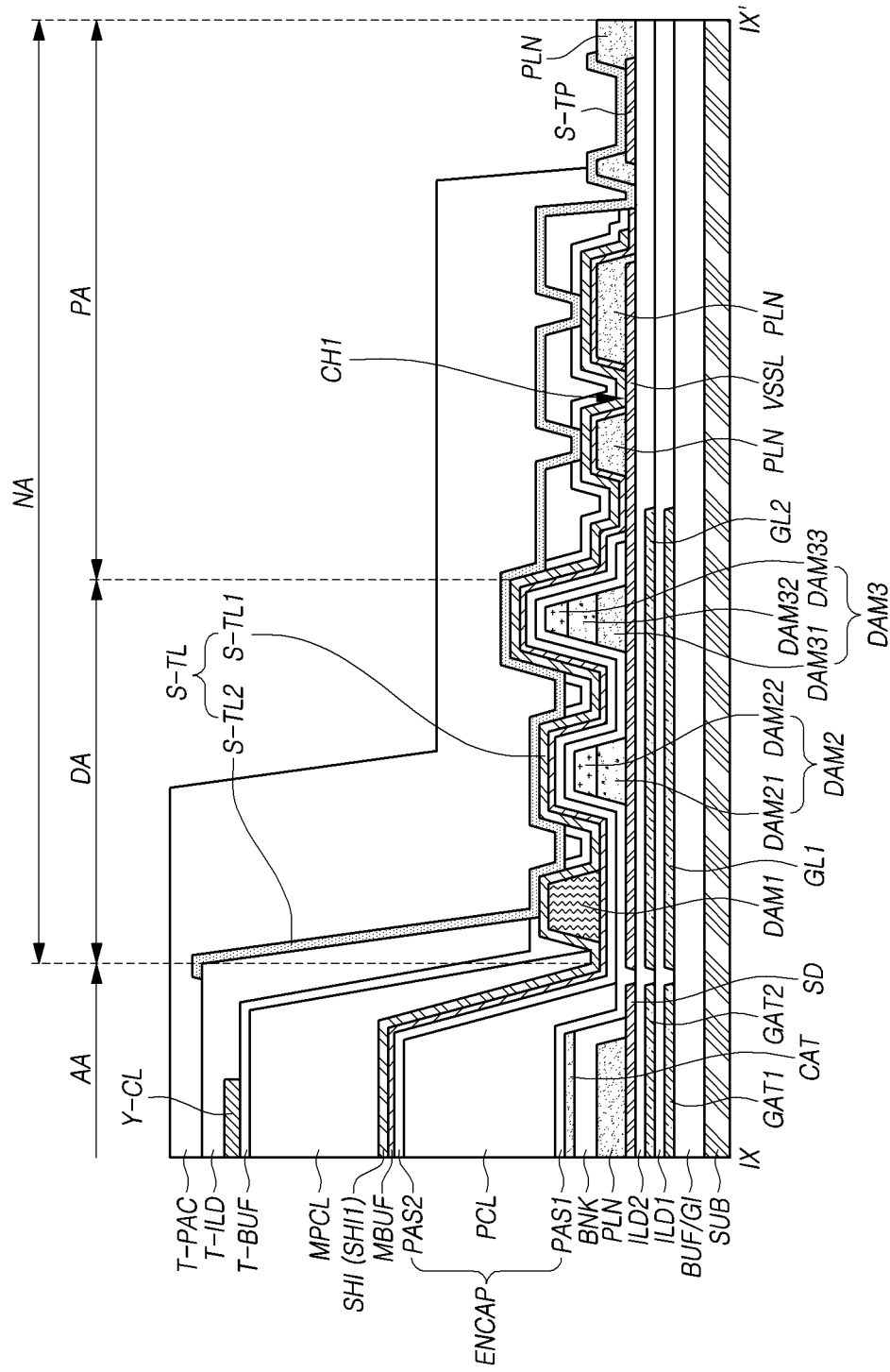
FIG. 10 is a cross-sectional view taken along line IX-IX' of FIG. 8.

FIG. 8 is an example view illustrating a touch panel according to an embodiment. FIG. 9 is a cross-sectional view taken along line IX-IX' of FIG. 8. FIG. 10 is a cross-sectional view of another embodiment, taken along line IX-IX' of FIG. 8.

FIG. 8 only illustrates the outline shapes of the touch electrode TE and the shielding electrode SHI, however, the touch electrode TE and the shielding electrode SHI may be mesh-type electrodes as shown in FIG. 4.

Referring to FIG. 8, a touch panel according to an embodiment may include a first touch electrode line X-TL electrically connected to a first touch group X-TEG and a second touch electrode line Y-TL electrically connected to a second touch group Y-TEG. Further, the touch panel may include a first touch pad X-TP electrically connected to the first touch group X-TEG through the first touch electrode line X-TL and a second touch pad Y-TP electrically connected to the second touch group Y-TEG through the second touch electrode line Y-TL. Here, there may be provided a plurality of first touch electrode lines X-TL, a plurality of second touch electrode lines Y-TL, a plurality of first touch pads X-TP, and a plurality of second touch pads Y-TP depending on touch electrodes TE corresponding thereto. An X touch electrode voltage driving supply can be provided to the first touch pads X-TP. It is also possible that a Y touch electrode voltage driving supply can be provided to the Y-TP. It is not required that each of the X and Y touch pads have a voltage driving supply provided, it is permitted that only one of them had a driving supply voltage provided. Alternatively, a driving voltage supply can be provided to both of them. The touch electrode voltage driving supply can be an alternating voltage or a constant voltage.

The touch panel may include a shielding electrode line S-TL electrically connected to the shielding electrode SHI. Further, the touch panel may include a shielding electrode pad S-TP electrically connected to the shielding electrode line S-TL. Here, there may be provided a plurality of shielding electrode lines S-TL and a plurality of shielding electrode pads S-TP depending on shielding electrodes SHI correspond thereto.

The first touch electrode line X-TL, the second touch electrode line Y-TL, and the shielding electrode line S-TL may be positioned in the display area AA and the non-display area NA. Specifically, the first touch electrode line X-TL, the second touch electrode line Y-TL, and the shielding electrode line S-TL may be positioned in a partial area of the display area AA and may be positioned in some areas of the dam area DA and the pad area PA of the non-display area NA. The first touch electrode line X-TL, the second touch electrode line Y-TL, and the shielding electrode line S-TL may be disposed along the first and second directions in the non-display area NA.

The first touch electrode line X-TL may extend from the outermost first touch electrode X-TE of the first touch group X-TEG, be disposed on the same layer, and include the same material.

The second touch electrode line Y-TL may extend from the outermost second touch electrode Y-TE of the second touch group Y-TEG, be disposed on the same layer, and include the same material.

The shielding electrode line S-TL may extend from the outermost shielding electrode SHI among the shielding electrodes SHI, be disposed on the same layer, and include the same material.

The first touch electrode line X-TL, the second touch electrode line Y-TL, and the shielding electrode line S-TL each may be implemented as a dual line including an upper electrode line and a lower electrode line with the touch insulation layer T-ILD interposed therebetween, configuring one first touch electrode line X-TL, one second touch electrode line Y-TL, and one shielding electrode line S-TL. The upper electrode line may extend from at least one of the first touch electrode X-TE, the second touch electrode Y-TE, and the shielding electrode SHI. The lower electrode line may extend from at least one of the first touch connection portion X-CL, the second touch connection portion Y-CL, and the shielding electrode SHI. The upper electrode line and the lower electrode line of the dual line may be electrically connected through the opening of the touch insulation layer T-ILD. The dual line may reduce resistance of the first and second touch electrode lines X-TL and Y-TL and the shielding electrode line S-TL.

The first touch pad X-TP, the second touch pad Y-TP, and the shielding electrode pad S-TP may be positioned in the non-display area NA.

The first touch electrode line X-TL, the second touch electrode line Y-TL, and the shielding electrode line S-TL each may be disposed on the encapsulation layer ENCAP and extend up to a partial area of the non-display area NA without the encapsulation layer ENCAP, and be electrically connected to the first touch pad X-TP, the second touch pad Y-TP, and the shielding electrode pad S-TP, respectively. Here, the encapsulation layer ENCAP may be positioned in the display area AA and, according to an embodiment, extend up to the non-display area NA.

The first touch pad X-TP may receive the touch driving signal and apply the touch driving signal to the first touch electrode X-TE through the first touch electrode line X-TL.

The second touch pad Y-TP may receive a touch sensing signal by a capacitance generated between the first touch electrode X-TE and the second touch electrode Y-TE by the touch drive signal from the second touch electrode Y-TE and the second touch electrode line Y-YL. The touch sensing signal is generated when a user touches the display.

The shielding electrode pad S-TP may receive a predetermined voltage (e.g., 0V, a driving low voltage, or a separate voltage of a selected value) and apply a predetermined voltage of a selected value to the shielding electrode SHI through the shielding electrode line S-TL. If a predetermined voltage is applied to the shielding electrode SHI, the parasitic capacitance generated between the touch electrode TE and the cathode electrode CAT, may be reduced due to the series connection operation. The parasitic capacitance between the touch electrode TE and the cathode electrode CAT is generally based on the sum of the first capacitance generated between the shielding electrode SHI and the touch electrode TE and the second capacitance generated between the shielding electrode SHI and the cathode electrode CAT, Accordingly, in the display driving according to an embodiment, by applying a voltage of a selected value, the shielding electrode SHI shields noise due to the parasitic capacitance generated between the cathode electrode CAT and the touch electrode TE, thereby enhancing the touch sensing performance of the display device.

In one embodiment, a dam area DA may be disposed in a boundary area between the display area AA and the non-display area NA or in the non-display area NA to prevent collapse of any one layer (e.g., the encapsulation layer in the organic light emitting display panel) in the display area AA.

As illustrated in FIG. 8, a first dam DAM1 and a second dam DAM2 may be disposed in the dam area DA. Here, the second dam DAM2 may be positioned further outside the first dam DAM1. According to an embodiment, only the first dam DAM1 may be positioned in the dam area DA. In some cases, one or more additional dams in addition to the first dam DAM1 and the second dam DAM2 may be further disposed in the dam area DA.

Referring to FIG. 9, a display device according to an embodiment may include a first gate pattern GAT1, a second gate pattern GAT2, and a source drain pattern SD disposed in each subpixel SP in the display area AA. Further, the display device may include a buffer layer BUF, a gate insulation layer GI, a first inter-layer insulation layer ILD1, a second inter-layer insulation layer ILD2, a planarization layer PLN, and a bank BNK disposed on a substrate SUB. The buffer layer BUF, the gate insulation layer GI, the first inter-layer insulation layer ILD1, and the second inter-layer insulation layer ILD2 may include an inorganic material. The planarization layer PLN and the bank BNK may include an organic material. According to an embodiment, at least one of the buffer layer BUF, the gate insulation layer GI, the first inter-layer insulation layer ILD1, and the second inter-layer insulation layer ILD2 may include an organic material. At least one of the planarization layer PLN and the bank BNK may include an inorganic material.

The display device may include a first gate line GL1, a second gate line GL2, and a voltage supply line VSSL disposed in the display area AA and/or the non-display area NA. Further, the display device may include a first dam DAM1, a second dam DAM2, and a third dam DAM3 disposed in the dam area DA of the non-display area NA.

The first gate pattern GAT1 and the first gate line GL1 may be positioned on the buffer layer BUF that prevents impurities from flowing in from the substrate SUB. The first inter-layer insulation layer ILD1 may cover the first gate pattern GAT1 and the first gate line GL1.

The second gate pattern GAT2 and the second gate line GL2 may be positioned on the first inter-layer insulation layer ILD1. The second inter-layer insulation layer ILD2 may cover the second gate pattern GAT2 and the second gate line GL2.

The source drain pattern SD and the power supply line VSSL may be positioned on the second inter-layer insulation layer ILD2, and the planarization layer PLN may be positioned on the source drain pattern SD and the power supply line VSSL. A bank BNK may be positioned on the planarization layer PLN, and a cathode electrode CAT may be positioned on the bank BNK. Although not shown in FIG. 9, the power supply line VSSL may be electrically connected to the cathode electrode CAT and may apply a driving low voltage to the cathode electrode CAT.

The display device may include encapsulation layers ENCAP including a first inorganic encapsulation layer PAS1, an organic encapsulation layer PCL, and a second inorganic encapsulation layer PAS2 disposed on the cathode electrode CAT, the second dam DAM2, and the third dam DAM3. The encapsulation layer ENCAP may be positioned in the display area AA and may be positioned in a partial area of the non-display area NA.

The organic encapsulation layer PCL containing an organic material may be positioned on an inner surface of the first dam DAM1. The second inorganic encapsulation layer PAS2 may be positioned on the substrate SUB on which the organic encapsulation layer PCL is disposed, to cover the respective top and side surfaces of the organic encapsulation layer PCL and the first inorganic encapsulation layer PAS1. The second inorganic encapsulation layer PAS2 may minimize or block penetration of external moisture or oxygen into the first inorganic encapsulation layer PAS1 and the organic encapsulation layer PCL. For example, the second inorganic encapsulation layer PAS2 may include an inorganic insulating material, such as silicon nitride (SiNx), silicon oxide (SiOx), silicon oxynitride (SiON), or aluminum oxide (Al2O3). According to an embodiment, a color filter may be further disposed on the encapsulation layer ENCAP. The color filter may be positioned on the touch electrode (TE, see FIG. 4 or 6) and may be positioned between the encapsulation layer ENCAP and the touch electrode TE.

An intermediate buffer layer MBUF may be positioned on the encapsulation layer ENCAP. The intermediate buffer layer MBUF may be positioned to cover the planarization layer PLN. A first dam DAM1 may be positioned on the intermediate buffer layer MBUF.

A second dam DAM2 and a third dam DAM3 may be positioned on the power supply line VSSL. The second dam DAM2 may include a 2-1th sub dam DAM21 and a 2-2th sub dam DAM22 stacked on the 2-1th sub dam DAM21. The third dam DAM3 may include a 3-1th subdam DAM31 and a 3-2th subdam DAM32 and a 3-3th subdam DAM33 stacked sequentially on the 3-1th subdam DAM31. The dam disposed in the dam area DA may prevent a liquid organic encapsulation layer PCL from collapsing to the non-display area NA and penetrating into the pad area PA when the liquid organic encapsulation layer PCL is dropped to the display area AA.

A shielding electrode SHI may be positioned on the intermediate buffer layer MBUF. The shielding electrode SHI may be positioned on the first dam DAM1 and may be positioned in the display area AA and the dam area DA and may be positioned in one area of the pad area PA.

The intermediate organic layer MPCL may be positioned on a portion of the shielding electrode SHI to cover at least a portion of the shielding electrode SHI. One side of the intermediate organic layer MPCL may be positioned adjacent to one side of the first dam DAM1 and may extend to an area between the display area AA and the dam area DA. The first dam DAM1 and the second and third dams DAM2 and DAM3 disposed in the dam area DA may prevent a liquid intermediate organic layer MPCL from collapsing to the non-display area NA and penetrating into the pad area PA when the liquid intermediate organic layer MPCL is dropped to the display area AA.

The touch buffer layer T-BUF may cover the intermediate organic layer MPCL and may be positioned over a portion of the dam area DA and a portion of the pad area PA. The touch buffer layer T-BUF may block penetration, into the light emitting layer including an organic layer, of external moisture or a chemical (e.g., developer or etchant) used in the manufacturing process of the touch electrode TE disposed on the touch buffer layer T-BUF. Accordingly, the touch buffer layer T-BUF may prevent damage to the light emitting layer, which is vulnerable to chemicals or moisture. According to an embodiment, the touch buffer layer T-BUF may be omitted, and the touch electrode TE may be directly formed on the intermediate organic layer MPCL.

The touch buffer layer T-BUF may be positioned on the shielding electrode line S-TL to expose at least a portion of the upper surface of the shielding electrode SHI. A portion of the upper surface of the shielding electrode line S-TL disposed on the first dam DAM1, the second dam DAM2, and the third dam DAM3 in the dam area DA may be exposed without being covered by the touch buffer layer T-BUF. Further, a part of the upper surface of the shielding electrode line S-TL disposed on the planarization layer PLN in the pad area PA may be exposed without being covered by the touch buffer layer T-BUF.

The second touch connection portion Y-CL may be positioned on the touch buffer layer T-BUF and may be positioned in the display area AA.

The touch insulation layer T-ILD covers at least a portion of the second touch connection portion Y-CL, be positioned over the touch buffer layer T-BUF, and be positioned over a partial area of the dam area DA and a partial area of the pad area PA. The touch insulation layer T-ILD may expose a portion of the upper surface of the second touch connection portion Y-CL. As described in connection with FIGS. 4 to 8, the second touch connection portion Y-CL may directly contact and electrically connect to the second touch electrode Y-TE through the contact hole of the touch insulation layer T-ILD.

Further, the touch insulation layer T-ILD may be positioned on the shielding electrode line S-TL to expose at least a portion of the upper surface of the shielding electrode line S-TL. A portion of the upper surface of the shielding electrode line S-TL disposed on the first dam DAM1, the second dam DAM2, and the third dam DAM3 in the dam area DA may be exposed without being covered by the touch insulation layer T-ILD. Further, a part of the upper surface of the shielding electrode line S-TL disposed on the planarization layer PLN in the pad area PA may be exposed without being covered by the touch insulation layer T-ILD.

The shielding electrode line S-TL may include a lower shielding electrode line S-TL1 and an upper shielding electrode line S-TL2. In other words, in an embodiment, the shielding electrode line S-TL may be implemented as a dual line.

The lower shielding electrode line S-TL1 may be disposed in the dam area DA and the pad area PA. The lower shielding electrode line S-TL1 may overlap the first dam DAM1, the second dam DAM2, and the third dam DAM3 in the dam area DA and may be positioned on the upper surfaces of the first dam DAM1 and the intermediate buffer layer MBUF. Further, the lower shielding electrode line S-TL2 may overlap the planarization layer PLN in the pad area PA and may be positioned on the upper surface of the intermediate buffer layer MBUF.

Referring to FIG. 10, the shielding electrode line S-TL may be electrically connected to the driving low voltage line VSSL exposed by an electrical contact hole CH1 in the intermediate buffer layer MBUF in the pad area PA. Specifically, the lower shielding electrode line S-TL1 of the shielding electrode lines S-TL may contact the upper surface of the driving low voltage line VSSL exposed by having a contact hole CH1 in the middle buffer layer MBUF and may electrically connect one of the lines SHI, for example, SHI1 or SHI2 to the driving low voltage line VSSL. When the same driving low voltage is applied to both the cathode electrode CAT and the shielding electrode SHI, the cathode electrode CAT and the shielding electrode SHI may be connected in parallel, and the resistance of the cathode electrode CAT decreases, so that touch noise (or touch noise peak) of the cathode electrode CAT may be reduced. According to an embodiment, the shielding electrode pad S-TP may not be separately formed.

The upper shielding electrode line S-TL2 may be positioned on the touch insulation layer T-ILD and may be disposed over a portion of the display area AA, the dam area DA, and the pad area PA. The upper shielding electrode line S-TL2 may directly contact the upper surface of the lower shielding electrode line S-TL1 exposed by the touch buffer layer T-BUF and the touch insulation layer T-ILD in the dam area DA and electrically connect to the lower shielding electrode line S-TL1.

The upper shielding electrode line S-TL2 may directly contact the upper surface of the lower shielding electrode line S-TL1 exposed by the touch buffer layer T-BUF and the touch insulation layer T-ILD in the pad area PA and electrically connect to the lower shielding electrode line S-TL1. In other words, the upper shielding electrode line S-TL2 and the lower shielding electrode line S-TL1 may be electrically connected through the contact holes of the touch buffer layer T-BUF and the touch insulation layer T-ILD in the non-display area NA. Further, the upper shielding electrode line S-TL2 may directly contact the upper surface of the shielding electrode pad S-TP exposed by the planarization layer PLN and electrically connect to the shielding electrode pad S-TP. In other words, the shielding electrode pad S-TP receiving a predetermined voltage may apply voltage to the upper shielding electrode line S-TL2 and the lower shielding electrode line S-TL1. As a predetermined voltage is applied to the shield electrode SHI through the shield electrode line S-TL, noise due to parasitic capacitance generated between the touch electrode TE and the cathode electrode CAT may be stably reduced.

The touch protection layer T-PAC may be positioned on the upper shielding electrode line S-TL2, protecting the upper shielding electrode line S-TL2. The touch protection layer T-PAC may expose the upper surface of the upper shielding electrode line S-TL2 contacting the shielding electrode pad S-TP, and a portion of the flexible printed circuit board may be disposed on the upper surface of the exposed upper shielding electrode line S-TL2.

Hereinafter, other example configurations of the touch panel are described with reference to FIGS. 11 and 12.

Figure 11:
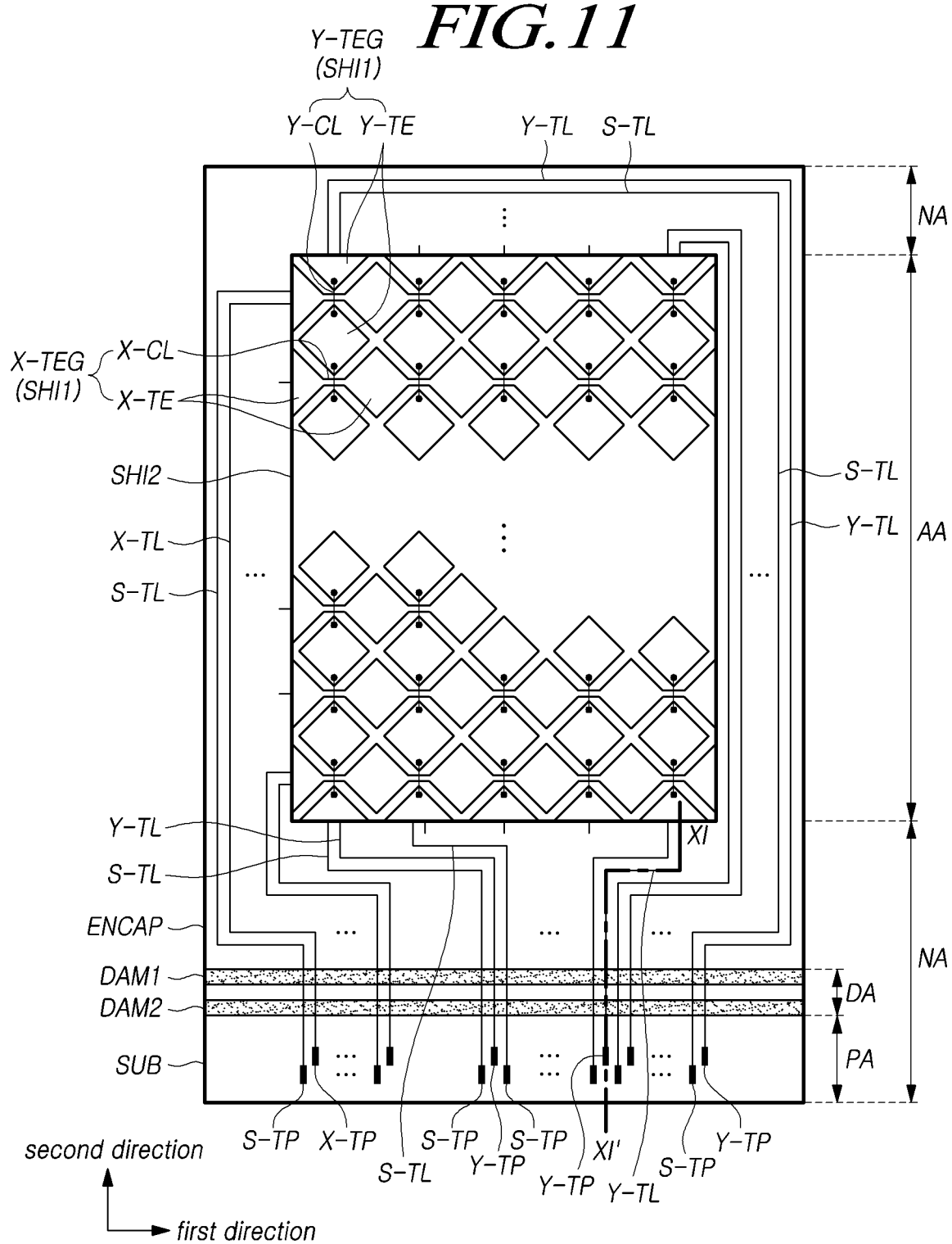
FIG. 11 is an example view illustrating a touch panel according to an embodiment.

FIG. 11 is an example view illustrating a touch panel according to an embodiment. FIG. 12 is a cross-sectional view taken along line XI-XI' of FIG. 11. The configurations shown in FIGS. 11 and 12 are similar to those shown in FIGS. 8 and 9, and no duplicate description is given of features common to the other embodiments and the following description focuses primarily on the differences from the prior embodiments described herein.

FIG. 11 only illustrates the outline shapes of the touch electrode TE and the first shielding electrode SHI1, however, the touch electrode TE and the first shielding electrode SHI1 may be mesh-type electrodes as shown in FIG. 4. Further, as shown in FIGS. 6 and 7, a second shielding electrode SHI2 may be disposed in the display area AA.

Referring to FIG. 11, the first shielding electrode SHI1 may be electrically connected to the second shielding electrode SHI2. The first shielding electrode SHI1 and/or the second shielding electrode SHI2 may be electrically connected to the shielding electrode line S-TL. Accordingly, the first shielding electrode SHI1 and the second shielding electrode SHI2 may receive a predetermined voltage from the shielding electrode pad S-TP. In an embodiment, the shielding electrode line S-TL extending from (or electrically connected to) the first shielding electrode SHI1 may include the same material as the first shielding electrode SHI1.

Figure 12:
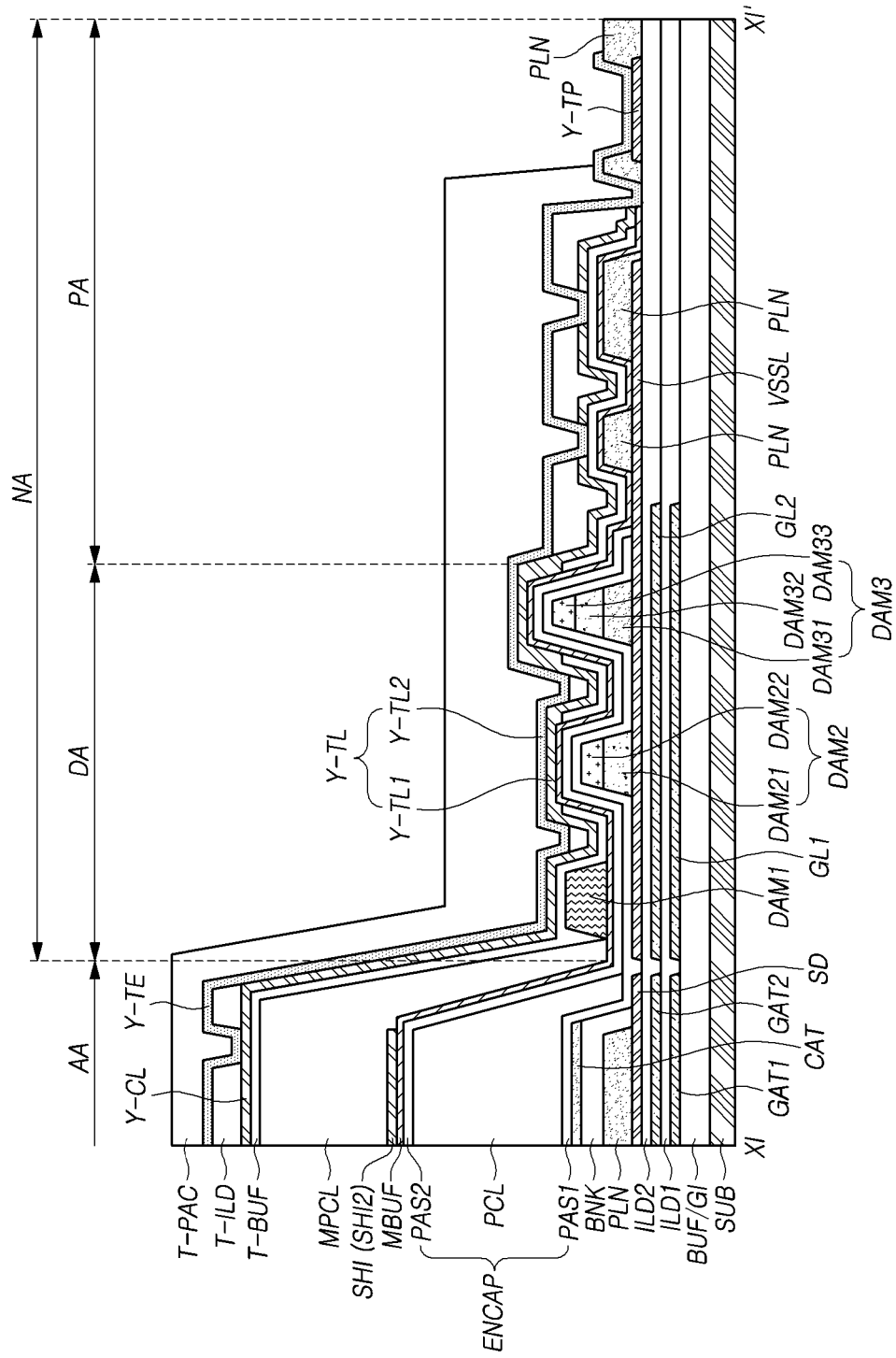
FIG. 12 is a cross-sectional view taken along line XI-XI' of FIG. 11.

Referring to FIG. 12, a display device according to an embodiment may include a shielding electrode SHI (or a second shielding electrode SHI2) positioned on the intermediate buffer layer MBUF. The shielding electrode SHI may be positioned in one area of the display area AA and, in cross-sectional view, may be disposed to overlap the cathode electrode CAT.

The intermediate organic layer MPCL may be positioned on the shielding electrode SHI to cover the shielding electrode SHI. The intermediate organic layer MPCL may be disposed in the display area AA and may be disposed in a partial area of the dam area DA. One side of the intermediate organic layer MPCL may be positioned adjacent to one side of the first dam DAM1 and may extend to an area between the display area AA and the dam area DA. The dam disposed in the dam area DA may prevent a liquid intermediate organic layer MPCL from collapsing to the non-display area NA and penetrating into the pad area PA when the liquid intermediate organic layer MPCL is dropped to the display area AA.

The touch buffer layer T-BUF may cover the intermediate organic layer MPCL and may be positioned over a portion of the dam area DA and a portion of the pad area PA. FIG. 11 illustrates that the touch buffer layer T-BUF is not positioned on the upper surface of the intermediate buffer layer MBUF overlapping the second dam DAM2 and the third dam DAM3 but, according to an embodiment, the touch buffer layer T-BUF may be positioned on the upper surface of the intermediate buffer layer MBUF overlapping the second dam DAM2 and the third dam DAM3.

The second touch connection portion Y-TL may be positioned on the touch buffer layer T-BUF and may be positioned in the display area AA.

The second touch electrode line Y-TL may include a second lower touch electrode line Y-TL1 and a second upper touch electrode line Y-TL2. In other words, in an embodiment, the second touch electrode line Y-TL may be implemented as a dual line.

The second lower touch electrode line Y-TL1 may be disposed in the dam area DA and the pad area PA. The second lower touch electrode line Y-TL1 may overlap the first dam DAM1, the second dam DAM2, and the third dam DAM3 in the dam area DA and be positioned on the upper surface of the intermediate buffer layer MBUF overlapping the touch buffer layer T-BUF, the second dam DAM2, and the third dam DAM3. The second lower touch electrode line Y-TL1 may overlap the planarization layer PLN in the pad area PA and may be positioned on the upper surface of the touch buffer layer T-BUF.

The second upper touch electrode line Y-TL2 may be positioned on the touch insulation layer T-ILD and may be disposed over a portion of the display area AA, the dam area DA, and the pad area PA. The second upper touch electrode line Y-TL2 may directly contact the upper surface of the second lower touch electrode line Y-TL1 exposed by the touch buffer layer T-BUF and the touch insulation layer T-ILD in the dam area DA and electrically connect to the second lower touch electrode line Y-TL1.

The second upper touch electrode line Y-TL2 may directly contact the upper surface of the second lower touch electrode line Y-TL1 exposed by the touch buffer layer T-BUF and the touch insulation layer T-ILD in the pad area PA and electrically connect to the second lower touch electrode line Y-TL1. Further, the second upper touch electrode line Y-TL2 may directly contact the upper surface of the second touch pad Y-TP exposed by the planarization layer PLN and electrically connect to the second touch pad Y-TP.

The touch protection layer T-PAC may be positioned on the second upper touch electrode line Y-TL2, protecting the second upper touch electrode line Y-TL2. The touch protection layer T-PAC may expose the upper surface of the second upper touch electrode line Y-TL2 contacting the second touch pad Y-TP, and a portion of the flexible printed circuit board may be disposed on the upper surface of the exposed second upper touch electrode line Y-TL2.

The display area of the display device is described below with reference to FIG. 13.

Figure 13:
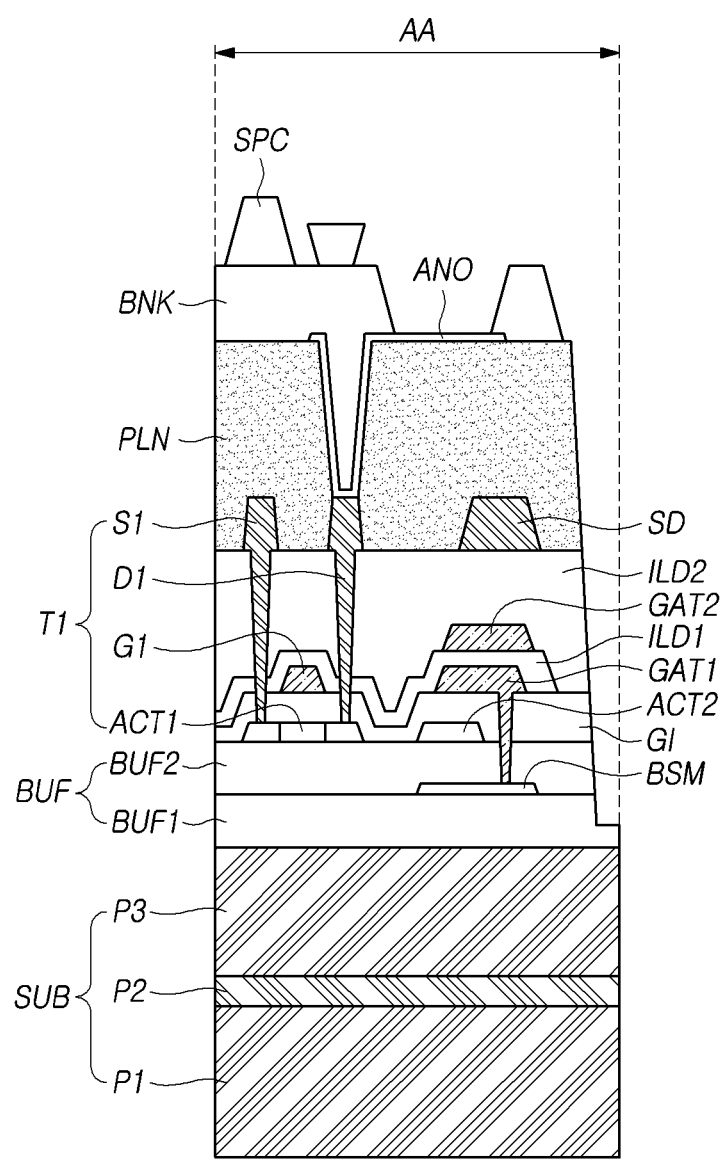
FIG. 13 is a cross-sectional view schematically illustrating a portion of a display area of a display device according to an embodiment.

FIG. 13 is a cross-sectional view schematically illustrating a portion of a display area of a display device according to an embodiment.

Referring to FIG. 13, a driving transistor T1, a lower metal layer BSM, an overlapping semiconductor layer ACT2, a first gate pattern GAT1, a second gate pattern GAT2, a source drain pattern SD, and an anode electrode ANO may be formed on a substrate SUB disposed in the display area AA of the display device. Here, the lower metal layer BSM, the overlapping semiconductor layer ACT2, the first gate pattern GAT1, the second gate pattern GAT2, and the source drain pattern SD may be disposed in a partial area of the non-display area NA (see FIG. 11). Further, the display device may include a buffer layer BUF, a gate insulation layer GI, a first inter-layer insulation layer ILD1, a second inter-layer insulation layer ILD2, a planarization layer PLN, a bank SPC, and a spacer SPC stacked on the substrate SUB.

The substrate SUB may be implemented as a flexible material and may include a first layer P1, a second layer P2, and a third layer P3. The first layer P1 and the third layer P3 may include polyimide or polyamide. The second layer P2 may include an inorganic material.

The buffer layer BUF may include an inorganic material, and may include a first buffer layer BUF1 and a second buffer layer BUF2. The first buffer layer BUF1 may be referred to as a multi-buffer layer. The second buffer layer BUF2 may be referred to as an active buffer layer.

The lower metal layer BSM may be positioned between the first buffer layer BUF1 and the second buffer layer BUF2.

A driving semiconductor layer ACT1 and an overlapping semiconductor layer ACT2 may be positioned on the buffer layer BUF. The driving semiconductor layer ACT1 may include a channel area, a source area, and a drain area overlapping the driving gate electrode G1. The driving semiconductor layer ACT1 and the overlapping semiconductor layer ACT2 may include oxide, amorphous silicon, polycrystalline silicon, or the like.

The gate insulation layer GI may cover the driving semiconductor layer ACT1 and the overlapping semiconductor layer ACT2. The gate insulation layer GI may include an inorganic material.

A driving gate electrode G1 and a first gate pattern GAT1 may be positioned on the gate insulation layer GI. The driving gate electrode G1, together with the driving semiconductor layer ACT1, the source electrode S1, and the drain electrode D1, may constitute the driving transistor T1.

The first inter-layer insulation layer ILD1 may cover the driving gate electrode G1 and the first gate pattern GAT1. The first inter-layer insulation layer ILD1 may include an inorganic material.

The second gate pattern GAT2 may be positioned on the first inter-layer insulation layer ILD1. The first gate pattern GAT1 may overlap the second gate pattern GAT2 to form a storage capacitor Cst (see FIG. 3).

The second inter-layer insulation layer ILD2 may cover the second gate pattern GAT2. The second inter-layer insulation layer ILD2 may include an inorganic material and/or an organic material.

A source electrode S1 and a drain electrode D1 may be positioned on the second inter-layer insulation layer ILD2, and a source-drain pattern SD may be positioned. The source electrode S1 may be electrically connected to the source area of the driving semiconductor layer ACT1 through contact holes formed in the second inter-layer insulation layer ILD2, the first inter-layer insulation layer ILD1, and the gate insulation layer GI. The drain electrode D1 may be electrically connected to the drain area of the driving semiconductor layer ACT1 through contact holes formed in the second inter-layer insulation layer ILD2, the first inter-layer insulation layer ILD1, and the gate insulation layer GI. As shown in FIGS. 9 and 12, the source drain pattern SD may be positioned to extend to the non-display area NA and may be implemented as, e.g., a data line, a driving voltage line, or a driving low voltage line VSSL (see FIG. 12).

The planarization layer PLN may cover the source electrode S1, the drain electrode D1, and the source-drain pattern SD. The planarization layer PLN may include an organic material.

The anode electrode ANO may be positioned on the planarization layer PLN. The anode electrode ANO may be electrically connected to the drain electrode D1 of the driving transistor T1 through the contact hole of the planarization layer PLN.

The bank BNK may be positioned on the planarization layer PLN and the anode electrode ANO and may at least partially expose the upper surface of the anode electrode ANO. Further, a regular trapezoidal spacer SPC and an inverted trapezoidal spacer SPC may be positioned on the bank BNK.

Although not shown in FIG. 13, a light emitting layer may be positioned on the exposed upper surface of the anode electrode ANO, the bank BNK, and the spacer SPC, and a cathode electrode CAT (see FIG. 12) may be positioned on the light emitting layer, so that the anode electrode ANO, light emitting layer, and cathode electrode CAT (see FIG. 12) may implement a light emitting element ED (see FIG. 3).

The touch sensitivity performance effects of the display device according to an embodiment are described below with reference to FIG. 14.

Figure 14:
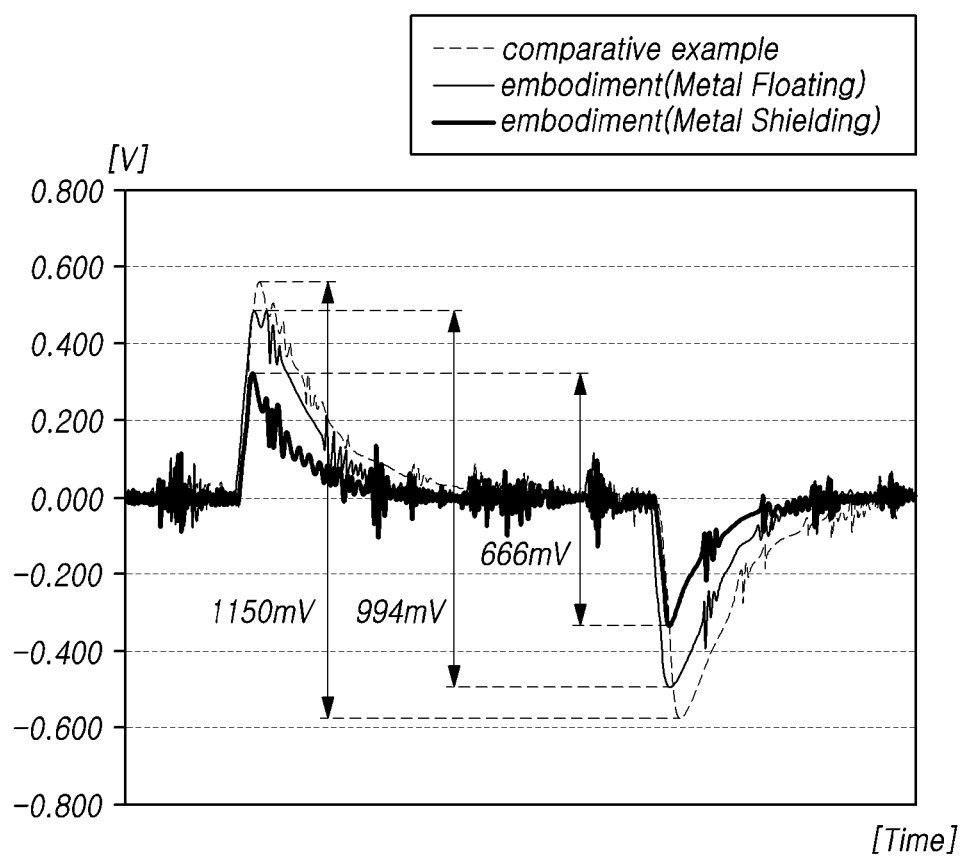
FIG. 14 is a graph illustrating touch sensing performance of a display device according to an embodiment and a display device according to a comparative example.

FIG. 14 is a graph illustrating touch sensing performance of a display device according to an embodiment of the present disclosure and also a display device according to a comparative example that does not use the teachings of the present disclosure, compared to each other.

Referring to FIG. 14, the display device according to the comparative example shown as a dashed line does not include a shielding electrode in the touch panel, another example shown with the shielding line floating in thin solid line and the display device according to an embodiment that includes a shielding electrode with a selected voltage applied in the touch panel shown as a heavy solid line according the legend of FIG. 14. As described in connection with FIGS. 4 to 12, the shielding electrode may be disposed between the cathode electrode and the touch electrode.

For the display device according to the comparative example, the touch noise of the cathode electrode was measured and, for the display device according to the embodiment, the touch noise of the cathode electrode depending on the presence or absence of a selected voltage applied to the shielding electrode was measured.

It may be identified that the touch noise voltage swing in the display device according to the comparative example corresponds to about 1150 mV, the touch noise voltage when no voltage is applied to the shielding electrode, labelled as metal floating in the embodiment corresponds to about 994 mV, and the touch noise voltage when a selected voltage or voltage signal pattern is applied to the shielding electrode, labelled as metal shielding in the embodiment corresponds to about 666 mV.

In other words, it may be identified that touch noise is reduced in the display device according to the embodiment as compared with the display device according to the comparative example, so that the noise voltage range is reduced. Further, in an embodiment, it may be identified that the noise voltage range is reduced further when power is applied to the shielding electrode, labelled as metal shielding as compared with when no power is applied to the shielding electrode, labelled as metal floating.

In the display device according to the embodiment, as the shielding electrode is disposed between the cathode electrode and the touch electrode, touch sensing performance may be enhanced and, as separate power is applied to the shielding electrode, touch sensing performance may further be enhanced.

Although the disclosure has been shown and described in connection with preferred embodiments thereof, it will be appreciated by one of ordinary skill in the art that various changes or modifications may be made thereto without departing from the spirit and technical scope of the disclosure described in the appended claims.

Therefore, the scope of the coverage is not limited to the detailed description of the disclosure, but should be defined by the language of the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate having a display area;
   a plurality of subpixels within the display area, each subpixel having an anode electrode, a light emitting layer, and a cathode electrode;
   an encapsulation layer positioned on the substrate overlying the plurality of subpixels;
   a shielding electrode positioned on the encapsulation layer and at least partially overlying the cathode electrode;
   a first insulating layer positioned on the shielding electrode;
   a touch electrode positioned on the first insulating layer and at least partially overlying the shielding electrode, the shielding electrode being positioned between the cathode and the touch electrode;
   a touch electrode voltage supply line coupled to the touch electrode;
   a touch insulation layer positioned on the touch electrode;
   a shielding electrode line electrically connected to the shielding electrode; and
   a shielding voltage supply electrically connected to the shielding electrode line;
   wherein the shielding electrode line includes:
   a first shielding electrode line extending from the shielding electrode; and
   a second shielding electrode line disposed on the touch insulation layer and electrically connected with the first shielding electrode line.

2. The display device of claim 1 further including:
   a shielding voltage pad that is electrically coupled to the shielding electrode line,
   wherein the shielding voltage supply is electrically connected to the shielding voltage pad.

3. The display device of claim 2 wherein the shielding voltage supply is a direct current voltage supply of a constant value.

4. The display device of claim 2 wherein the shielding voltage supply includes an alternating current voltage supply whose voltage value varies at a selected frequency.

5. The display device of claim 2 wherein the shielding voltage supply is in a floating voltage state.

6. The display device of claim 2 further including:
   a touch electrode voltage driving supply voltage;
   an electrical connection from the touch electrode voltage driving supply to the touch electrode; and
   an electrical connection from the touch electrode voltage driving supply to the shielding voltage pad to cause the shield electrode to be coupled to the touch electrode voltage driving supply to maintain the shield electrode at the same voltage as the touch electrode.

7. The display device of claim 2 further including:
   a non-display area on the substrate;
   a dam in the non-display area; and
   wherein the shielding voltage pad is positioned in the non-display area and the dam is positioned between the shielding voltage pad and the display area.

8. A display device, comprising:
   a substrate including a display area having subpixels are disposed and a non-display area, each of the subpixels including an anode electrode, a light emitting layer, and a cathode electrode configured for displaying an image;
   an encapsulation layer positioned on the substrate;

a shielding electrode positioned on the encapsulation layer;

an intermediate organic layer positioned on the shielding electrode;

a touch electrode positioned on the intermediate organic layer;

a touch insulation layer positioned on the touch electrode;

a shielding electrode line electrically connected with the shielding electrode; and a shielding electrode pad electrically connected with the shielding electrode line and configured to provide the shielding electrode with a shielding voltage through the shielding electrode pad and wherein the shielding electrode line includes:

a first shielding electrode line extending from the shielding electrode; and a second shielding electrode line disposed on the touch insulation layer and electrically connected with the first shielding electrode line.

9. The display device of claim 8 wherein the shielding voltage is a constant DC voltage.

10. The display device of claim 8 wherein the shielding voltage includes an AC voltage.

11. The display device of claim 8, wherein the first shielding electrode at least partially overlaps the touch electrode.

12. The display device of claim 8, wherein the first-shielding electrode has a mesh shape, wherein the touch electrode has a mesh shape, and wherein the shielding electrode at least partially overlaps the touch electrode.

13. The display device of claim 8 further including a transparent shielding electrode positioned on the encapsulation layer and extending over the entire display area, the shielding electrode being directly on the transparent shielding electrode.

14. The display device of claim 8, further comprising:

an intermediate buffer layer positioned between the encapsulation layer and the shielding electrode; and a touch buffer layer positioned between the intermediate organic layer and the touch electrode.

15. The display device of claim 14, wherein the non-display area includes a dam area having at least one dam disposed therein and a pad area having at least one pad disposed therein, wherein the dam area surrounds at least one surface of the display area, and wherein one side of the intermediate organic layer is positioned adjacent to one side of the at least one dam and is disposed between the display area and the dam area.

16. The display device of claim 8, wherein in the non-display area, the first shielding electrode line and the second shielding electrode line are electrically connected through a contact hole in the touch insulation layer and the touch buffer layer.

17. The display device of claim 8, further comprising:

a touch electrode line electrically connected with the touch electrode; and a touch pad electrically connected with the touch electrode line, wherein the touch electrode includes a first touch electrode and a second touch electrode, wherein the touch electrode line includes a first touch electrode line electrically connected with the first touch electrode and a second touch electrode line electrically connected with the second touch electrode, and wherein the touch pad includes a first touch pad electrically connected with the first touch electrode line to apply a touch driving signal to the first touch electrode and a second touch pad electrically connected with the second touch electrode line to receive a touch sensing signal from the second touch electrode.

18. A display device, comprising:

a substrate having a display area;

a plurality of subpixels within the display area, each subpixel having an anode electrode, a light emitting layer, and a cathode electrode;

a cathode voltage supply line electrically connected to the cathode electrode and configured to provide a low voltage supply to the cathode electrode;

an encapsulation layer positioned on the substrate overlying the plurality of subpixels;

a buffer insulation layer positioned on the encapsulation layer;

a shielding electrode positioned on the buffer insulation layer encapsulation layer and at least partially overlying the cathode electrode;

a first insulating layer positioned on the shielding electrode;

a touch electrode positioned on the first insulating layer and at least partially overlying the shielding electrode, the shielding electrode being positioned in a vertical stack that is between the cathode electrode and the touch electrode;

a touch insulation layer positioned on the touch electrode; and a shielding electrode line electrically connected with the shielding electrode;

wherein the shielding electrode line includes:

a first shielding electrode line extending from the shielding electrode; and a second shielding electrode line disposed on the touch insulation layer and electrically connected with the first shielding electrode line.

19. The display device of claim 18 wherein the shielding electrode is electrically isolated and is floating electrically.

20. The display device of claim 18 further including:

an electrical connection extending from the shielding electrode line to a voltage source.

21. The display device of claim 20 further including:

a non-display area adjacent to the display area;

a dam positioned in the non-display area; and a voltage supply pad positioned in the non-display area, wherein the dam is positioned between the display area and the voltage supply pad, wherein the buffer insulation layer extends from the display area into the non-display area and overlays at least a portion of the voltage supply pad.

22. The display device of claim 21 further including:

a contact hole in the buffer insulation layer exposing the voltage supply pad, the shielding electrode line extending into the contact hole and being coupled to the voltage supply pad at the contact hole.

* * * * *

UNITED STATES PATENT AND TRADEMARK OFFICE
CERTIFICATE OF CORRECTION

| | | |
|---|---|---|
| PATENT NO. | : 12,307,036 B2 | Page 1 of 1 |
| APPLICATION NO. | : 18/342621 | |
| DATED | : May 20, 2025 | |
| INVENTOR(S) | : JiHyun Jung et al. | |

It is certified that error appears in the above-identified patent and that said Letters Patent is hereby corrected as shown below:

In the Claims

Column 23, Claim 11, Lines 24-25:
"the first shielding" should read: --the shielding--.

Column 23, Claim 12, Lines 27-28:
"the first- shielding" should read: --the shielding--.

Signed and Sealed this
Twelfth Day of August, 2025

Coke Morgan Stewart
*Acting Director of the United States Patent and Trademark Office*